United States Patent [19]
Tanaka et al.

[11] Patent Number: 6,026,025
[45] Date of Patent: Feb. 15, 2000

[54] ELECTRICALLY ERASABLE AND PROGRAMMABLE NON-VOLATILE SEMICONDUCTOR MEMORY WITH AUTOMATIC WRITE-VERIFY CONTROLLER

[75] Inventors: Tomoharu Tanaka, Yokohama; Yoshiyuki Tanaka, Tokyo; Hiroshi Nakamura, Yokohama; Hideko Odaira, Tokyo, all of Japan

[73] Assignee: Kabushiki Kaisha Toshiba, Kawasaki, Japan

[21] Appl. No.: 09/096,466

[22] Filed: Jun. 12, 1998

Related U.S. Application Data

[63] Continuation of application No. 08/749,935, Nov. 14, 1996, Pat. No. 5,768,190, which is a continuation of application No. 08/473,739, Jun. 7, 1995, Pat. No. 5,627,782, which is a continuation of application No. 08/277,514, Jul. 19, 1994, Pat. No. 5,566,105, which is a continuation of application No. 07/948,002, Sep. 21, 1992, Pat. No. 5,357,462.

[30] Foreign Application Priority Data

Sep. 24, 1991 [JP] Japan ..................................... 3-243743
Dec. 25, 1991 [JP] Japan ..................................... 3-343363

[51] Int. Cl.[7] ................................................. G11C 16/04
[52] U.S. Cl. ............................... 365/185.22; 365/185.02; 365/185.18
[58] Field of Search ........................ 365/185.22, 185.02, 365/185.17, 185.18

[56] References Cited

U.S. PATENT DOCUMENTS

| | | | |
|---|---|---|---|
| 5,172,338 | 12/1992 | Mehrotra et al. | 365/185.03 |
| 5,357,462 | 10/1994 | Tanaka et al. | 365/185.22 |
| 5,361,227 | 11/1994 | Tanaka et al. | 365/185.22 |

FOREIGN PATENT DOCUMENTS

| | | | |
|---|---|---|---|
| 62-188100 | 8/1987 | Japan | G11C 17/00 |

*Primary Examiner*—Andrew Q. Tran
*Attorney, Agent, or Firm*—Oblon, Spivak, McClelland, Maier & Neustadt, P.C.

[57] ABSTRACT

A NAND-cell type EEPROM includes an array of memory cells connected to bit lines. Each cell includes one transistor with a floating gate and a control gate electrode, wherein electrons are tunneled to or from the floating gate to write a data thereinto. A sense/latch circuit is connected to the bit lines, and selectively performs a sense operation and a latch operation of the write data. A program controller is provided for writing the data into a selected memory cell in a designated area, and for reading the data written in the selected cell to verify whether or not its resultant threshold voltage falls within an allowable range. If it is insufficient, the data is rewritten thereinto. A rewrite-data setting section is provided for performing a logic operation with respect to a read data from the selected cell and the write data being latched in the sense/latch circuit, and for updating automatically a rewrite data being stored in the sense/latch circuit with respect to every bit line in accordance with the actual write state as being verified. The sense/latch circuit includes a CMOS flip-flop circuit, which acts as a data-latch at the beginning of the verify operation, and serves as a sense amplifier once after it is reset.

9 Claims, 34 Drawing Sheets

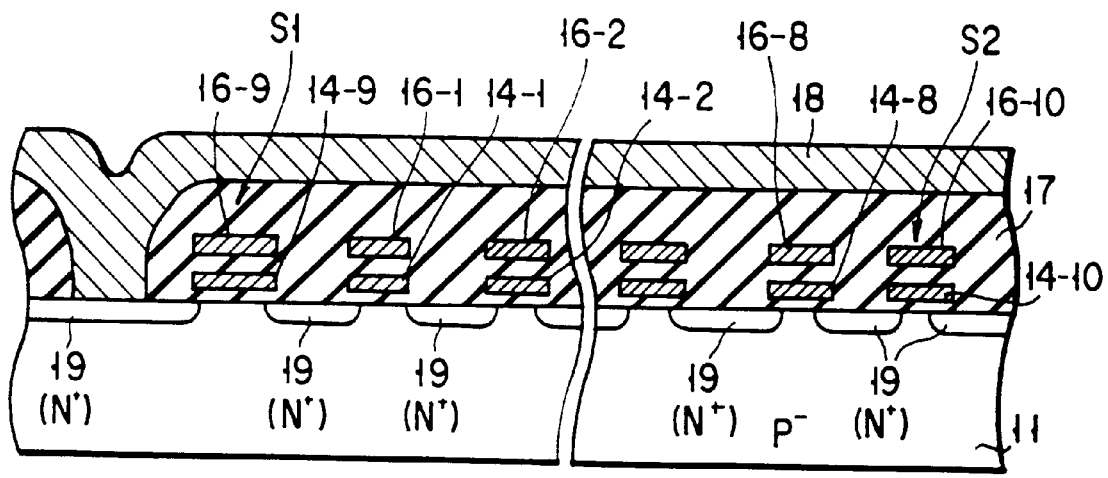
F I G. 3A
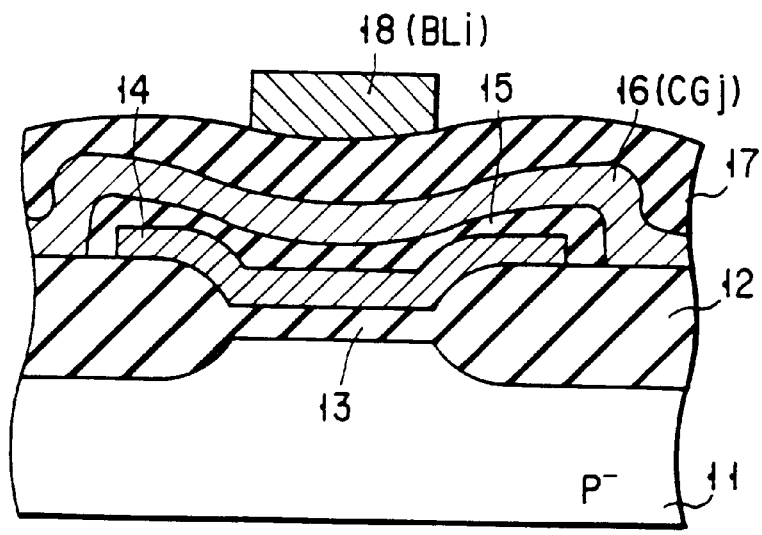
F I G. 3B

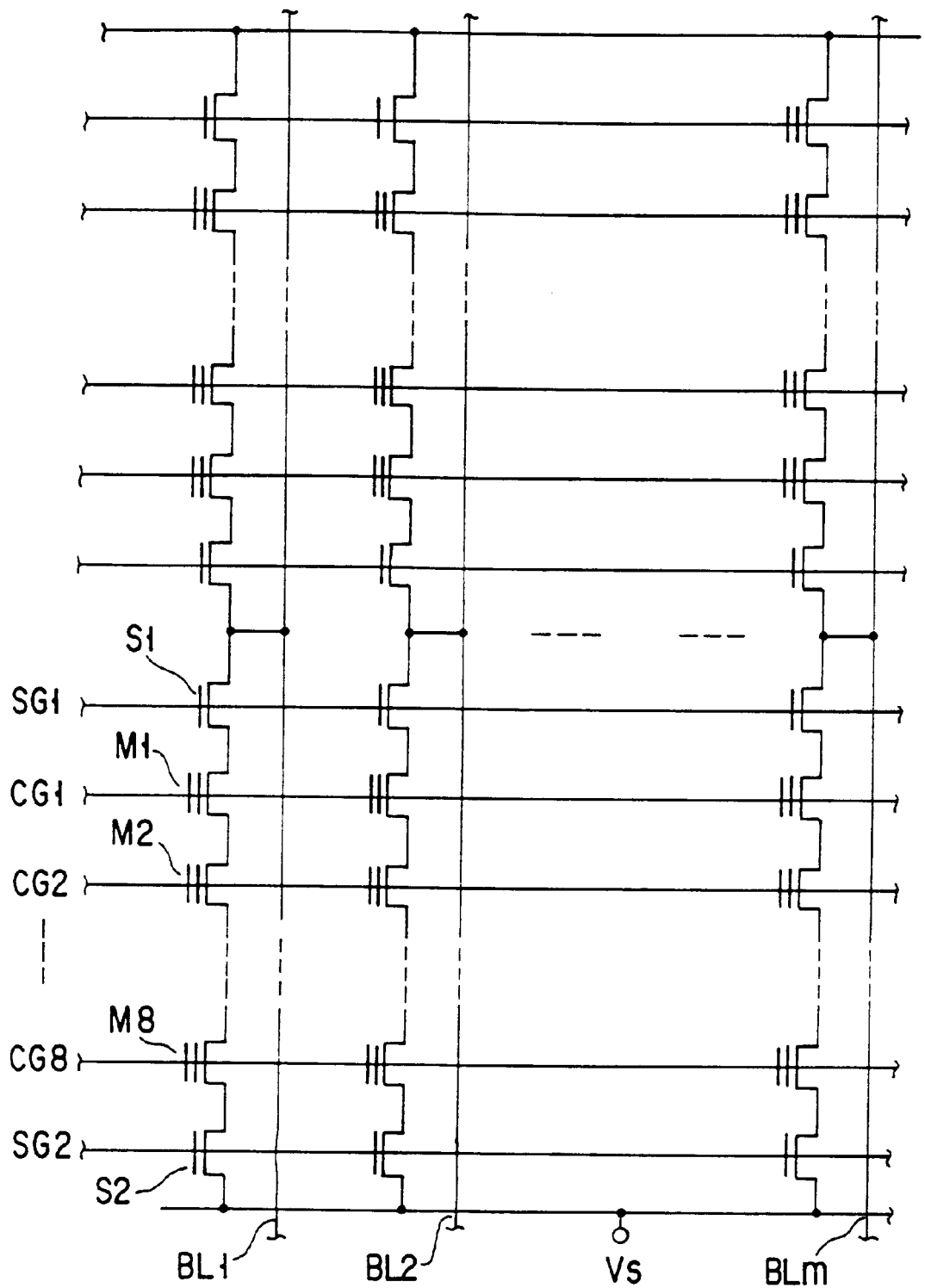
F I G. 4

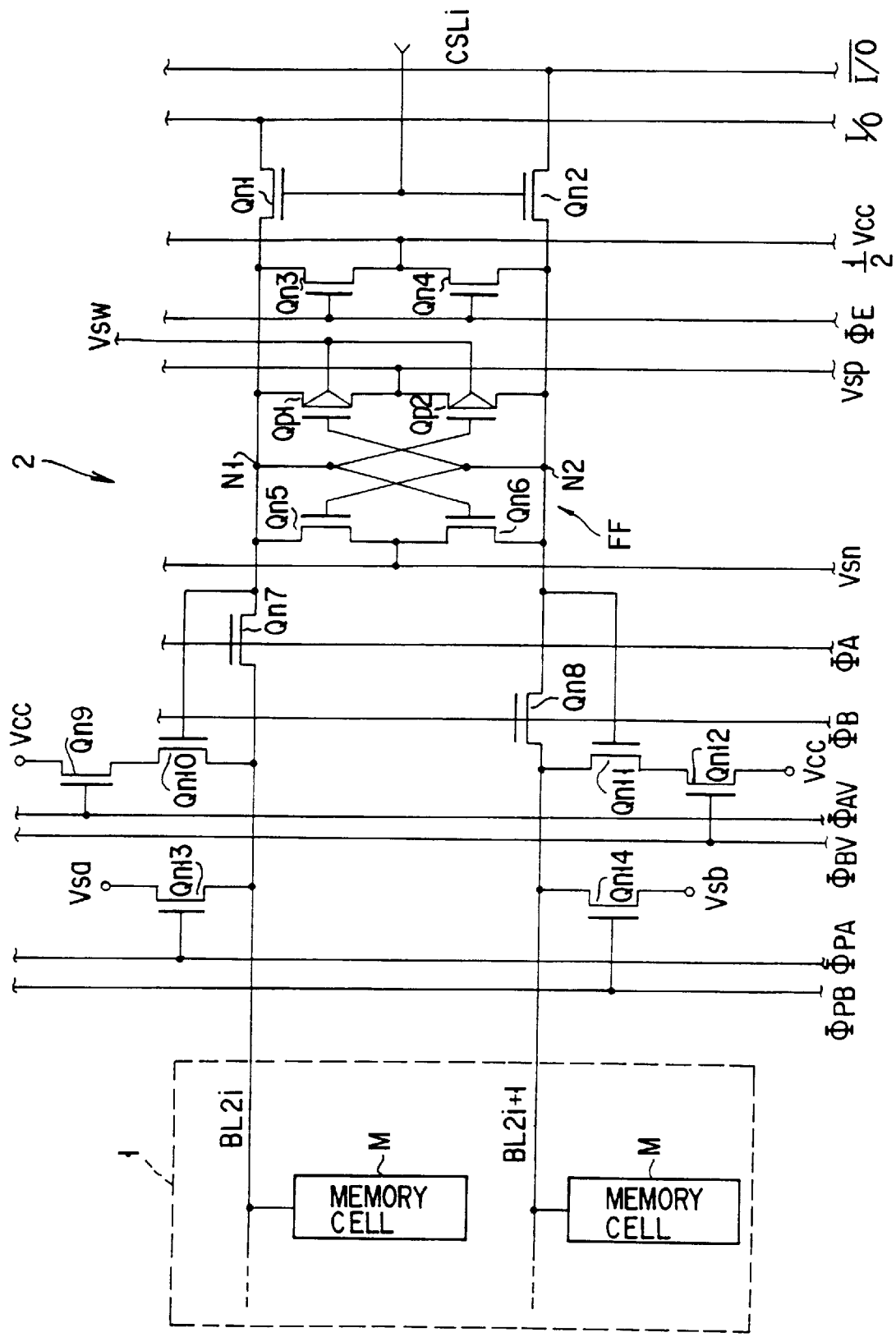
F I G. 5

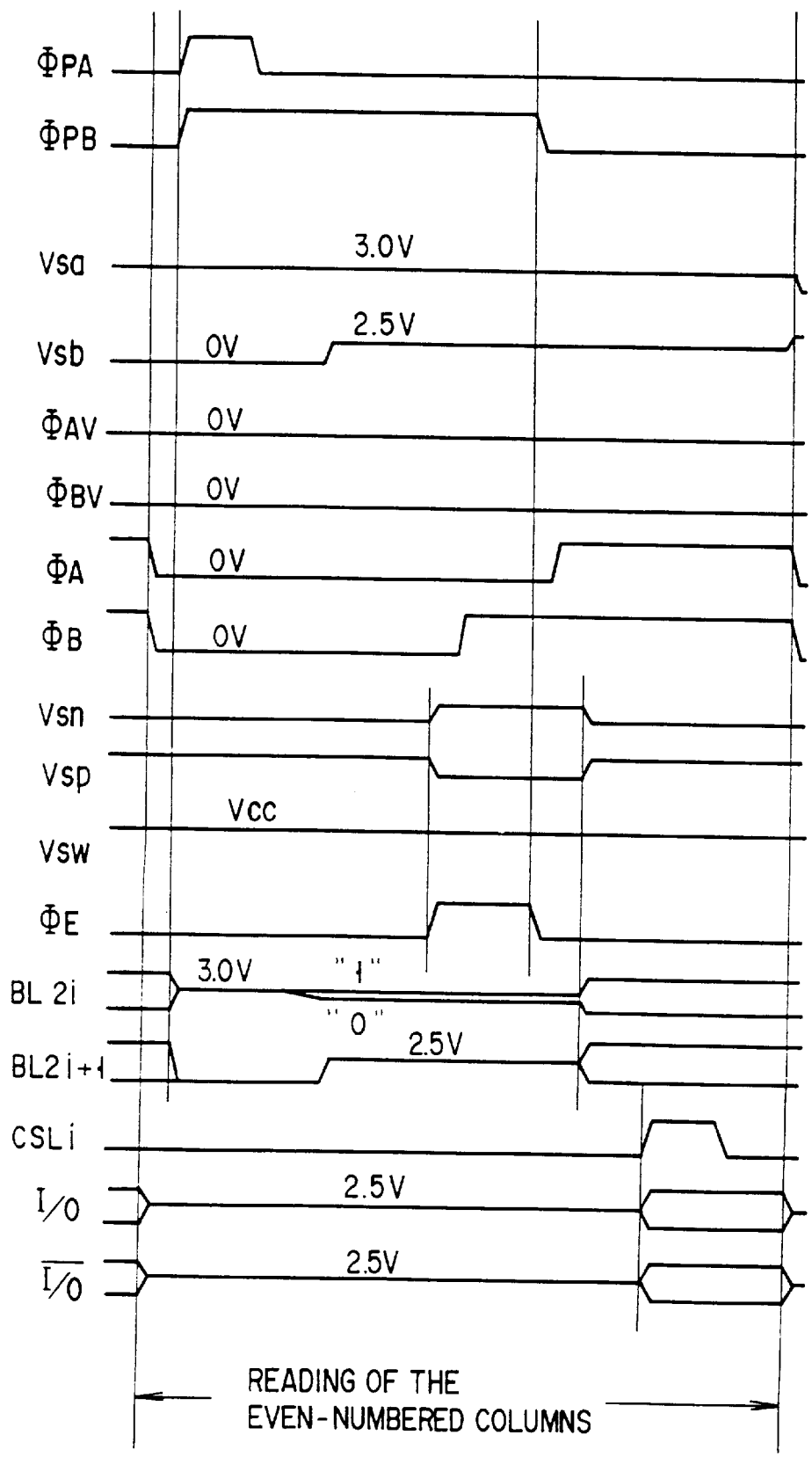
F I G. 6

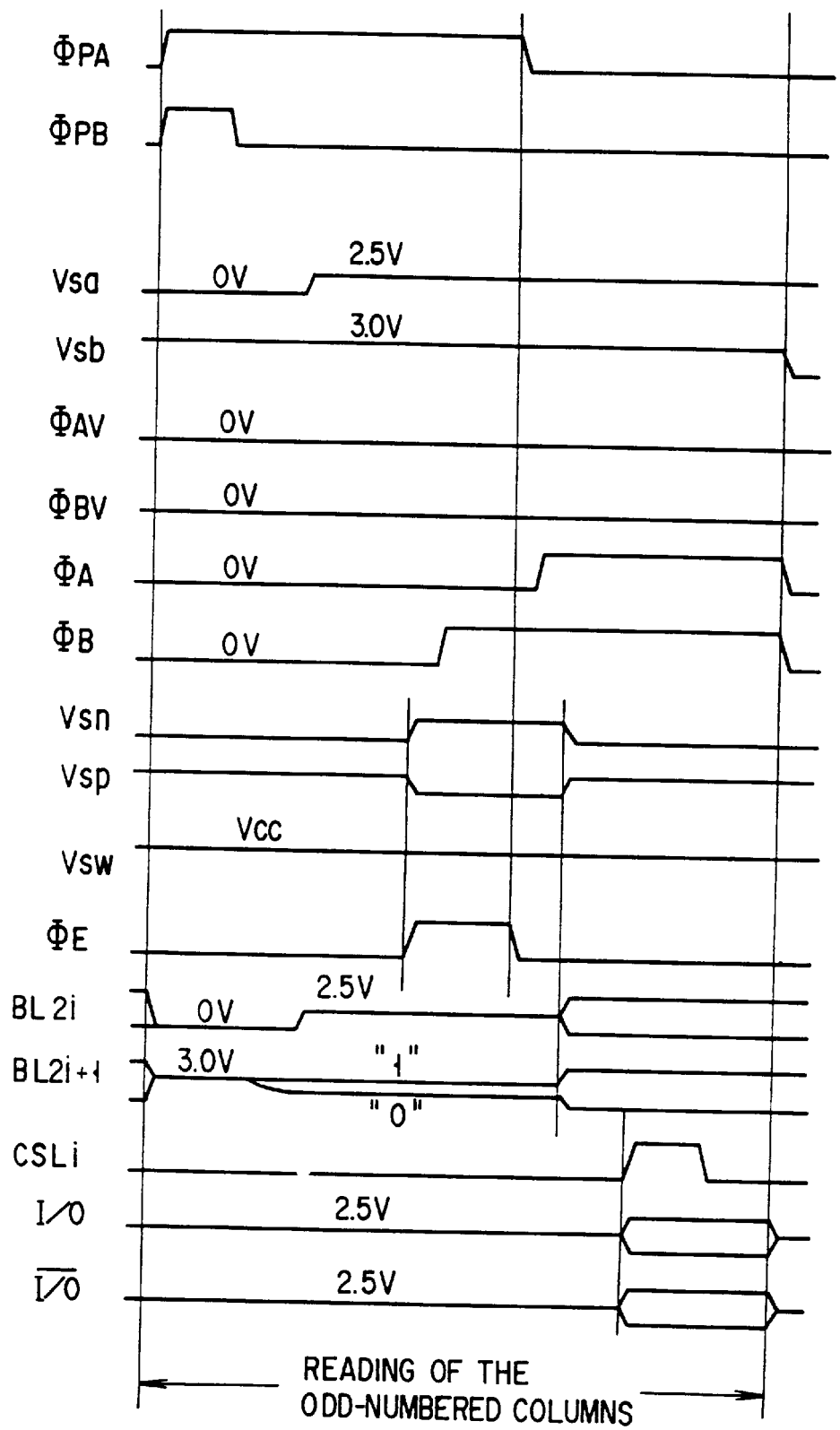
F I G. 7

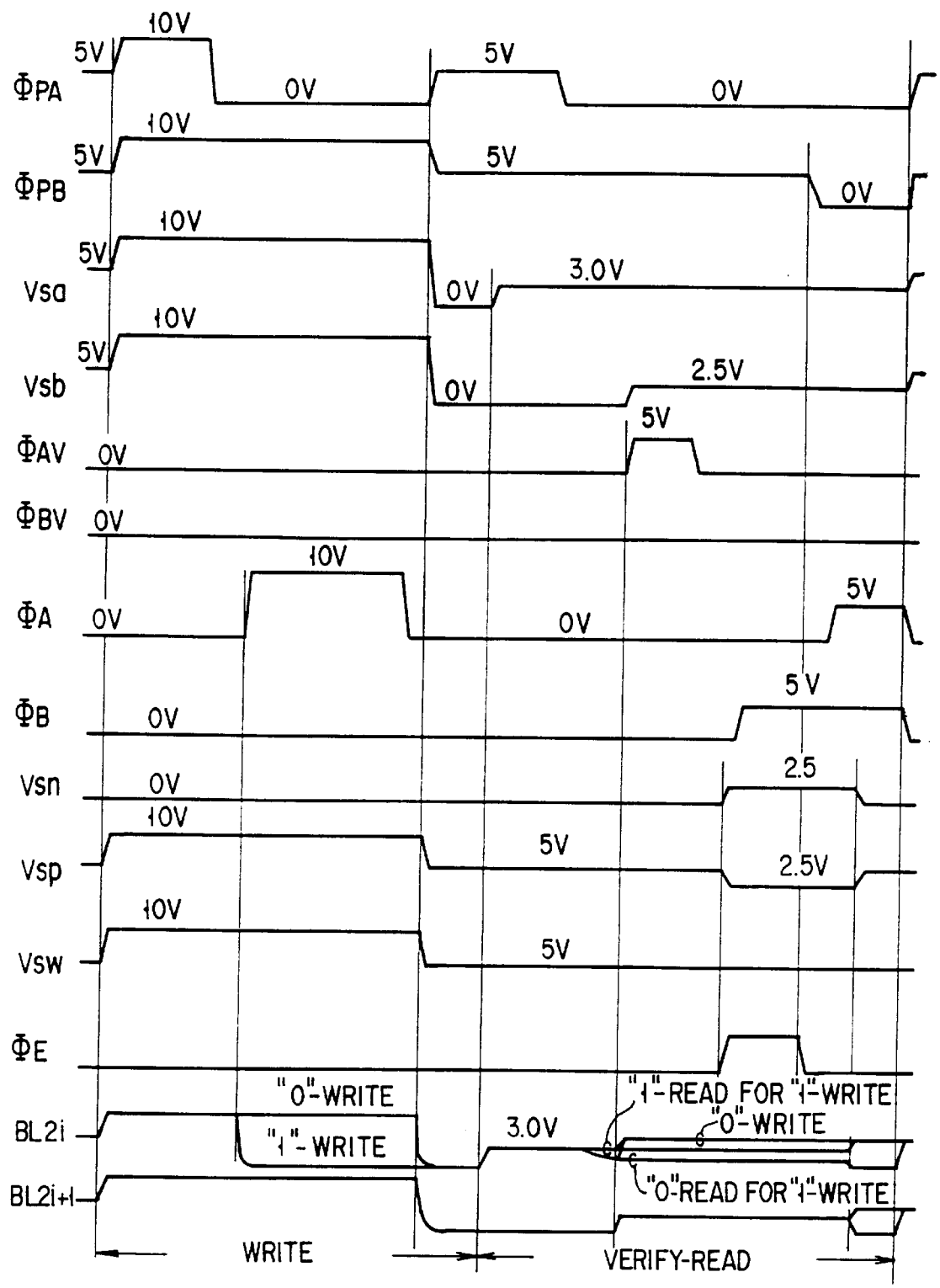
F I G. 8

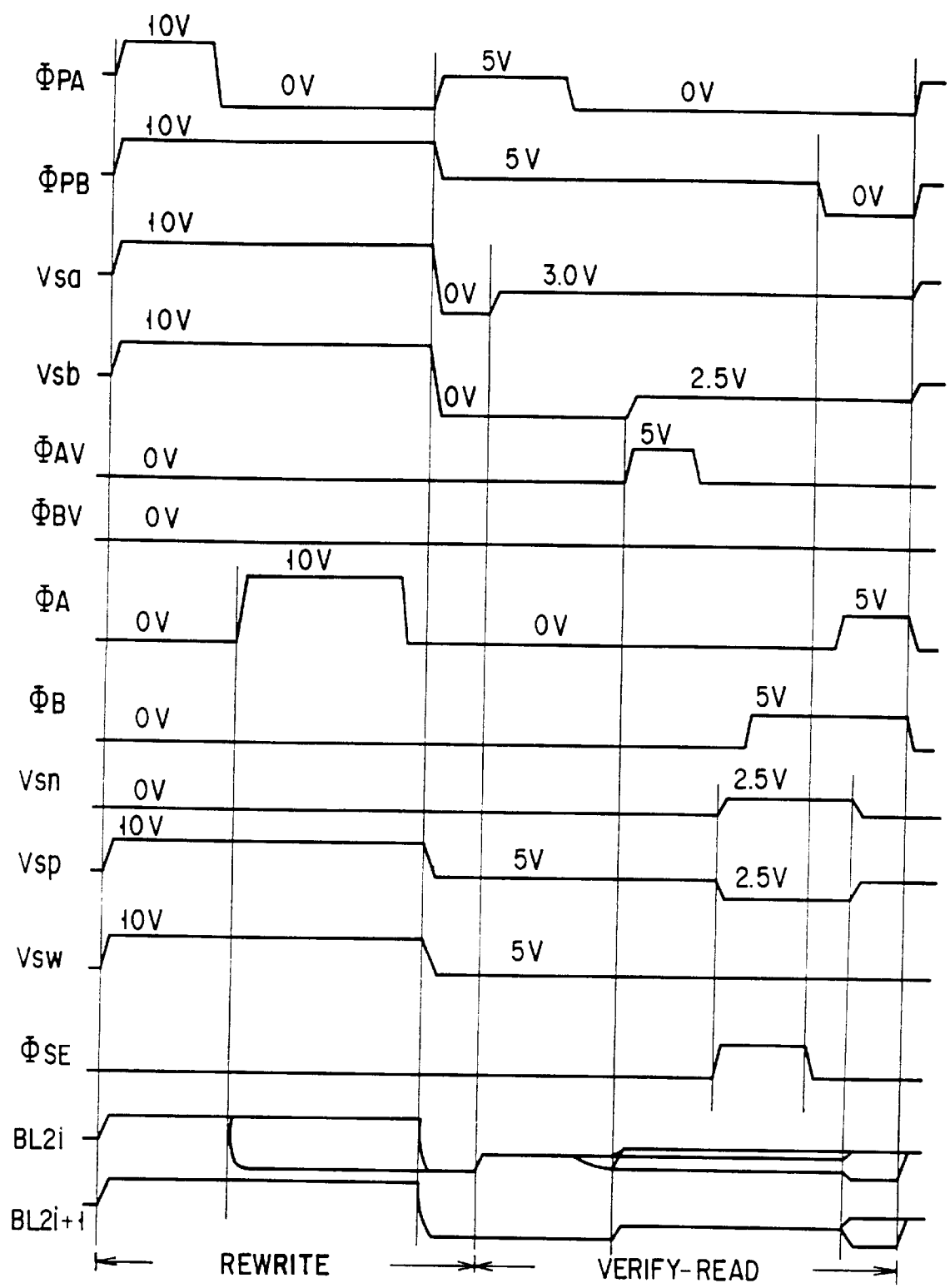
F I G. 9

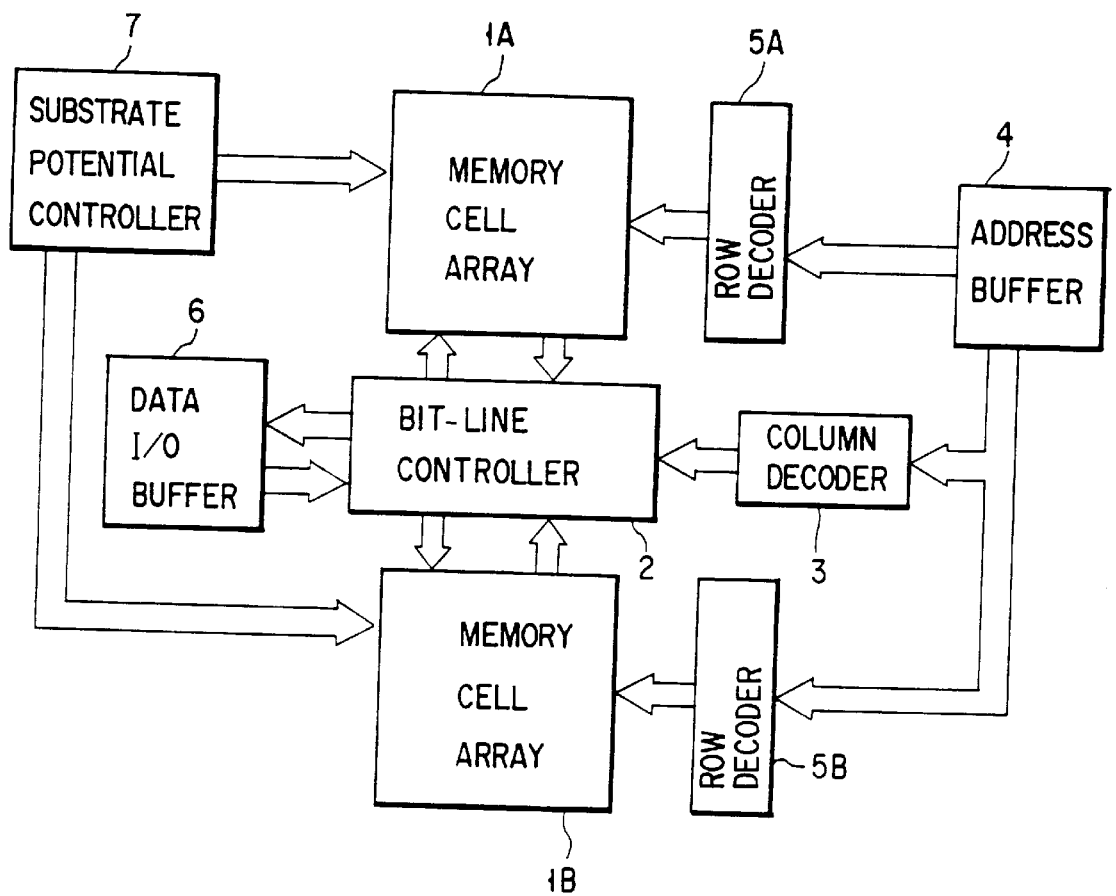
F I G. 13

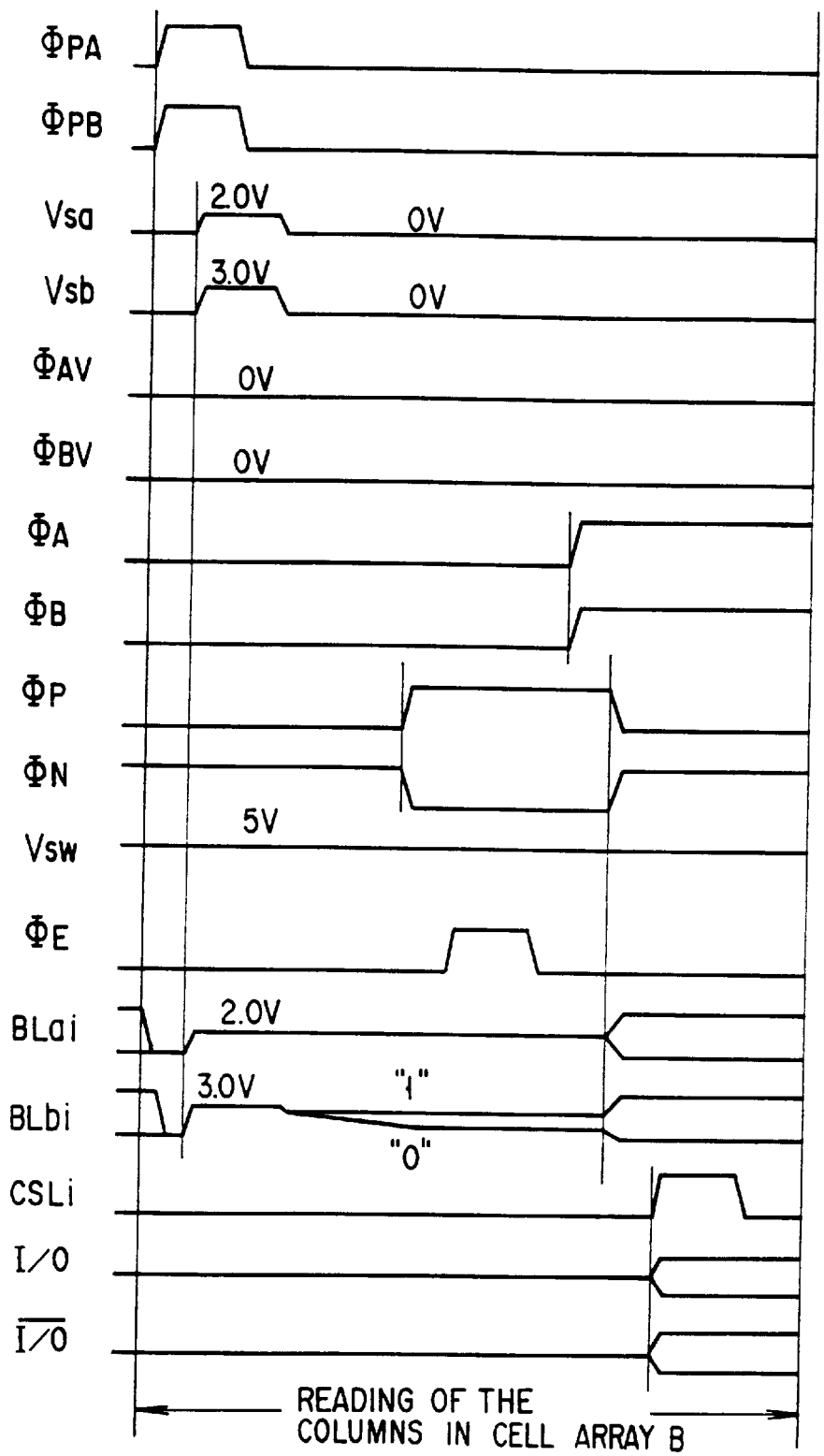
F I G. 16

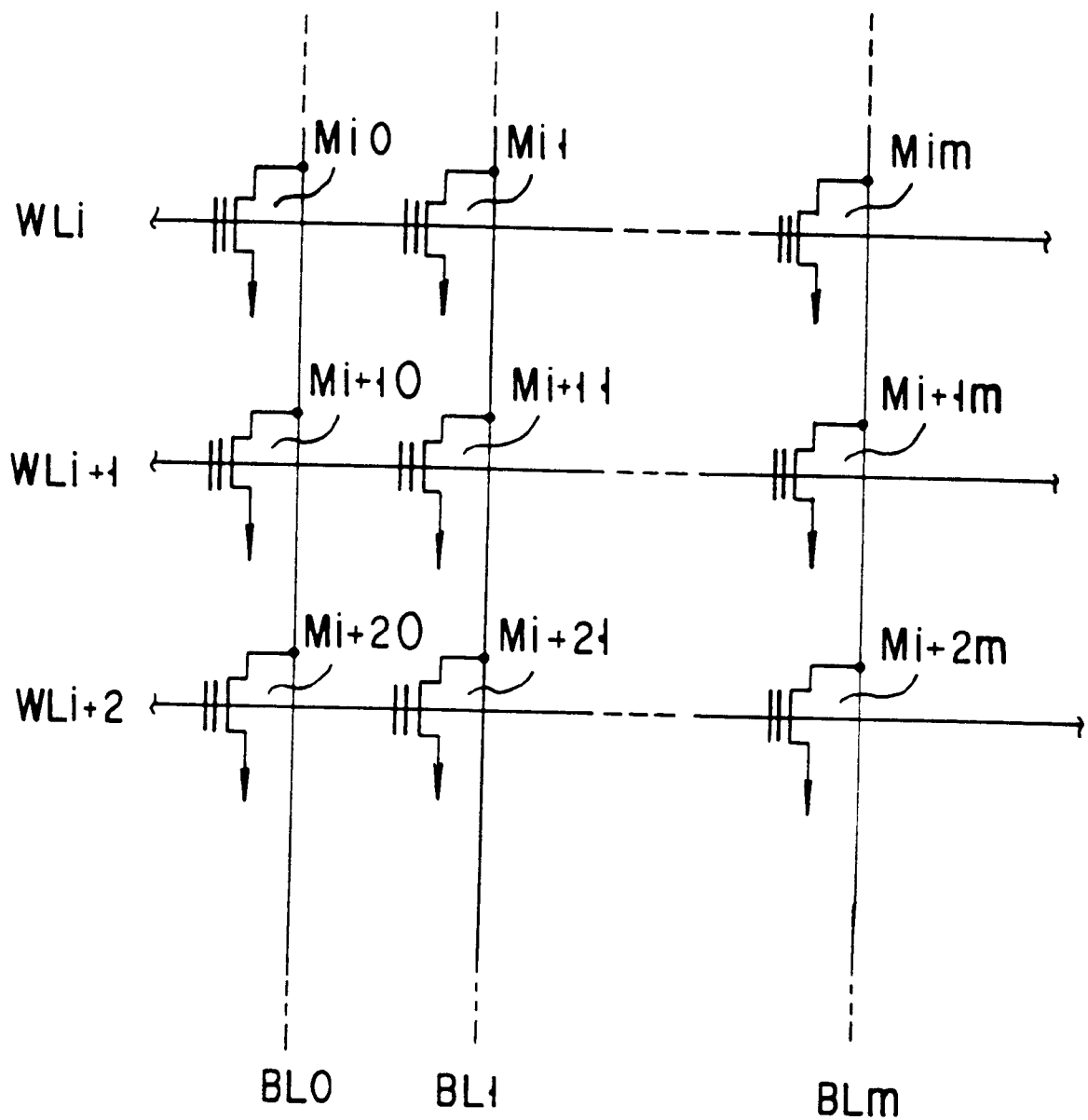
F I G. 19

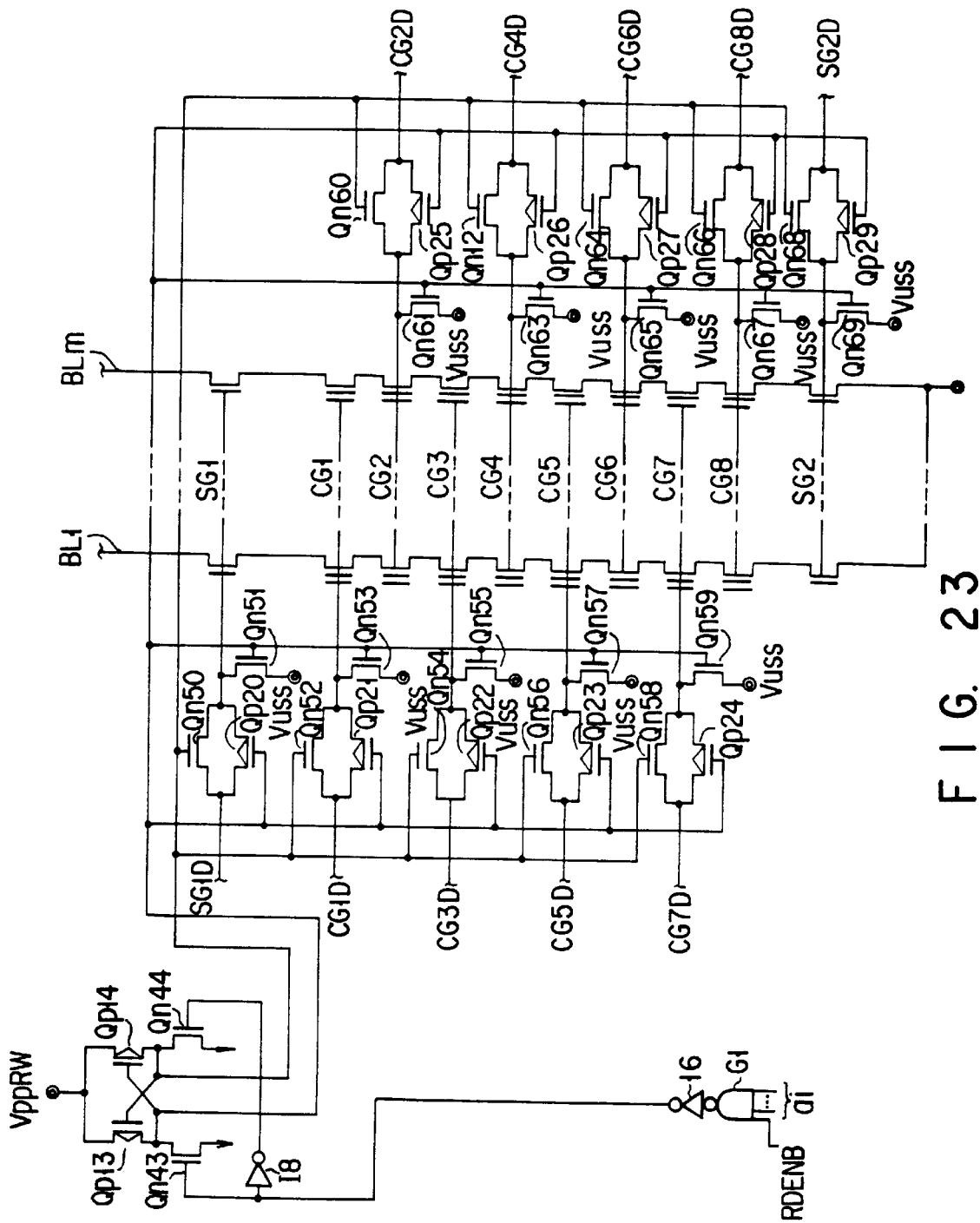
F I G. 23

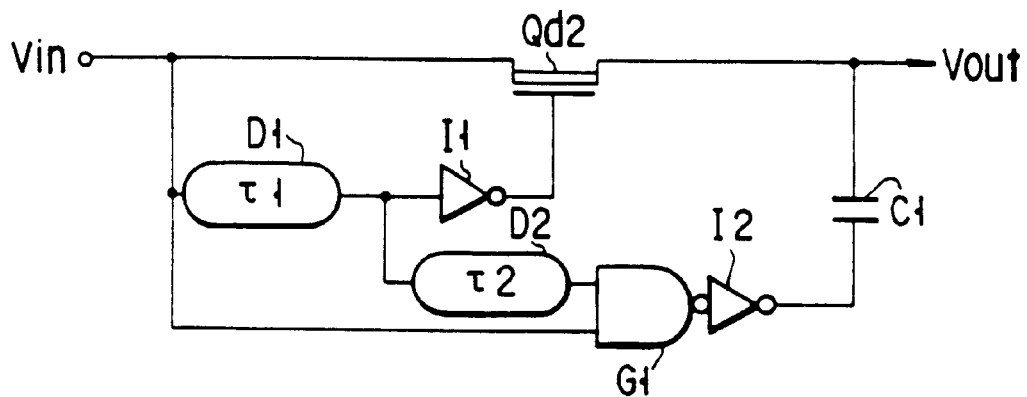
F I G. 25A
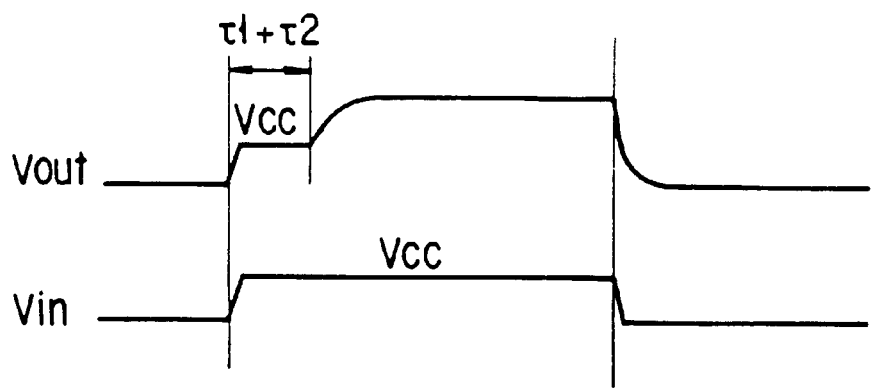
F I G. 25B

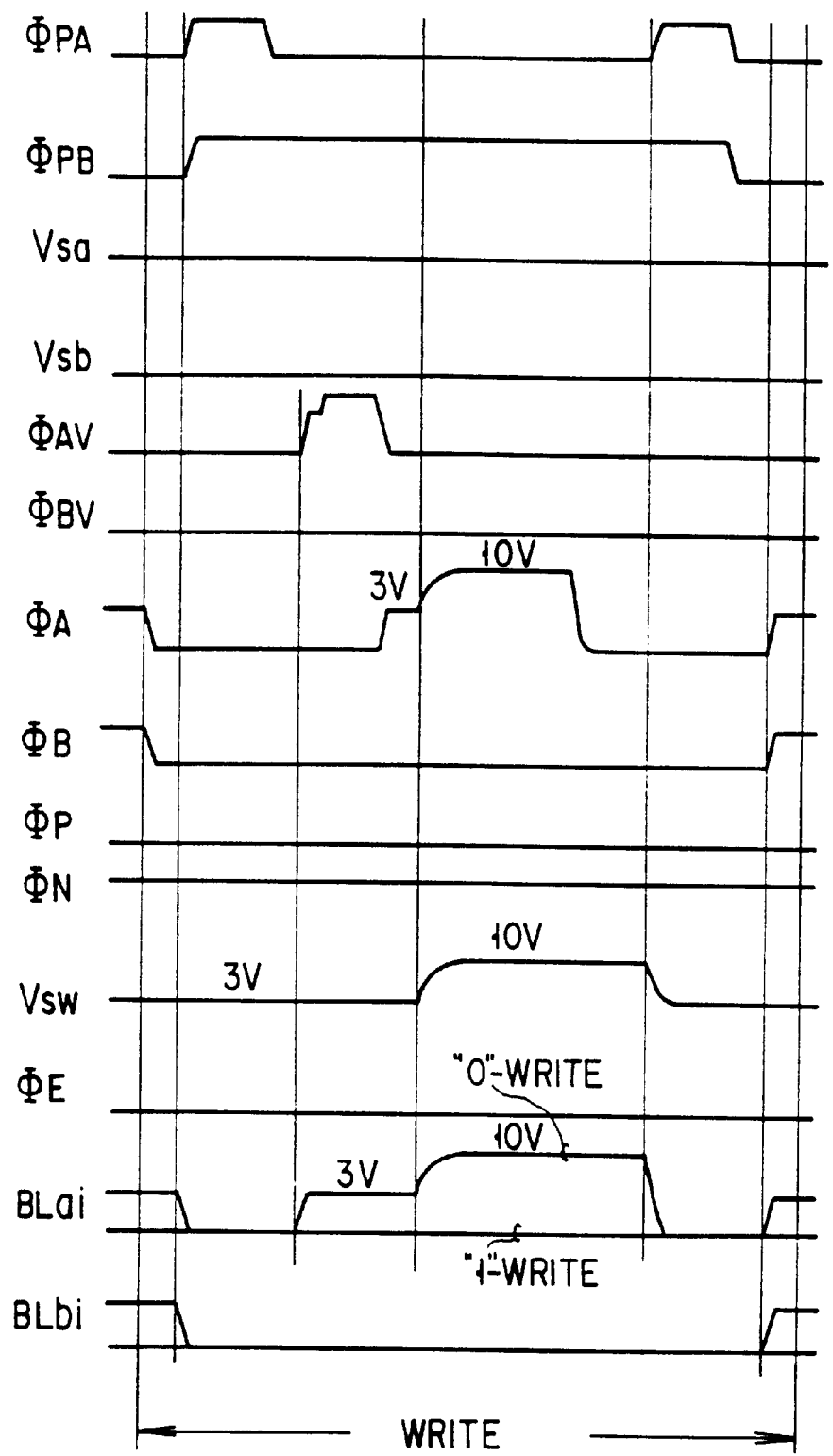
F I G. 29

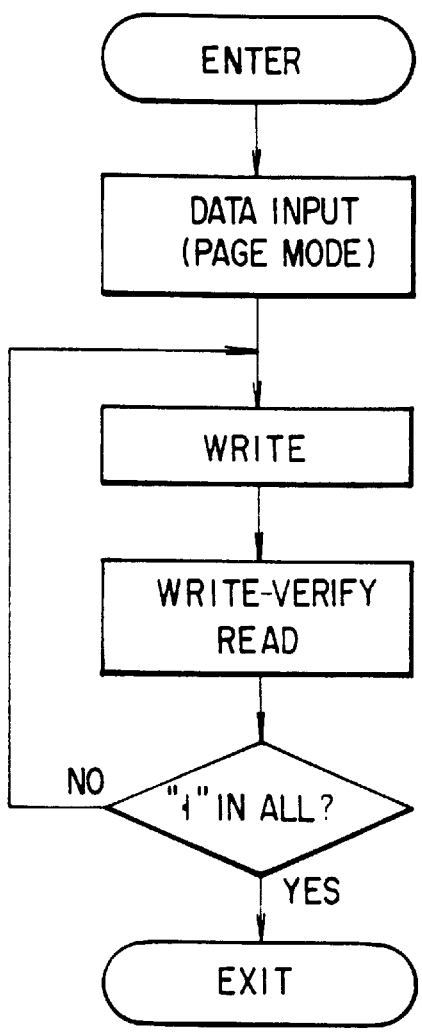
F I G. 34A
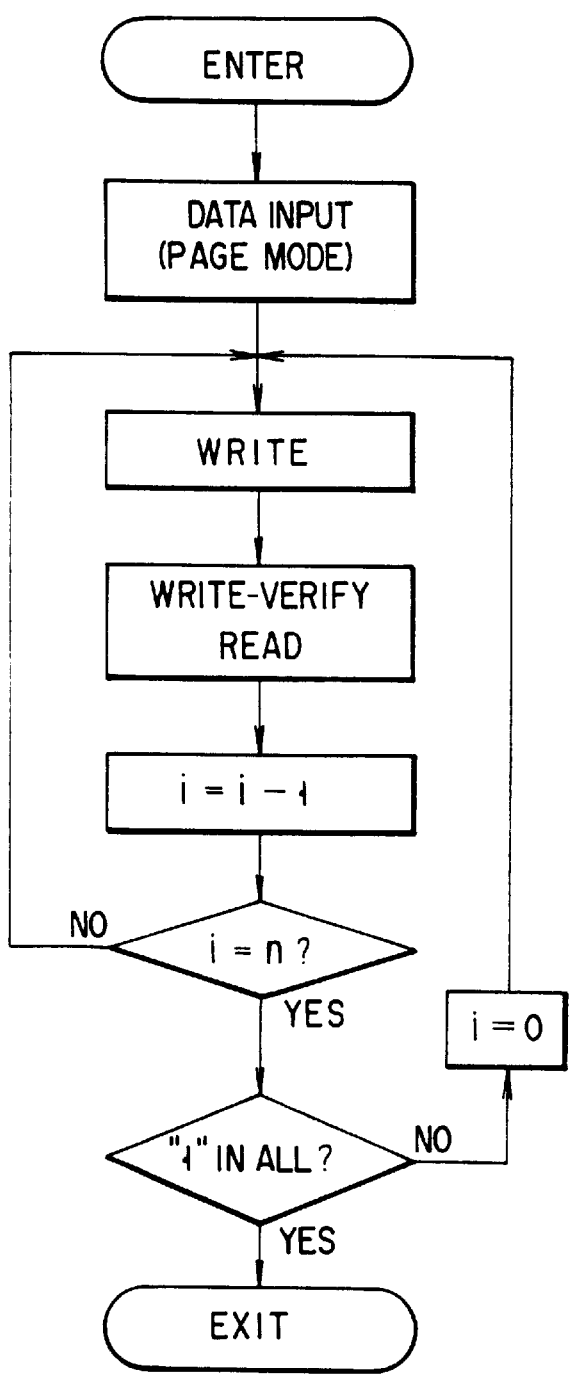
F I G. 34B

ELECTRICALLY ERASABLE AND PROGRAMMABLE NON-VOLATILE SEMICONDUCTOR MEMORY WITH AUTOMATIC WRITE-VERIFY CONTROLLER

This is a Continuation of application Ser. No. 08/749,935, filed Nov. 14, 1996, now U.S. Pat. No. 5,768,190; which is a Continuation of Ser. No. 08/473,739, filed Jun. 7, 1995, now U.S. Pat. No. 5,627,782; which is a Continuation of Ser. No. 08/277,514, filed Jul. 19, 1994, now U.S. Pat. No. 5,566,105; which is a Continuation of Ser. No. 07/948,002, filed Sep. 21, 1992, now U.S. Pat. No. 5,357,462.

BACKGROUND OF THE INVENTION

1. Field of the Invention

The present invention relates generally to electrically erasable and programmable non-volatile semiconductor memory devices, and more particularly to an electrically erasable and programmable read only memory having an array of memory cells each of which essentially consists of one transistor.

2. Description of the Related Art

Recently, NAND-cell type EEPROMs have been developed as one of highly integrated electrically erasable and programmable read-only memory (EEPROM) devices. With such type EEPROMs, an array of rows and columns of memory cells are divided into a plurality of cell sections coupled to parallel bit lines. Each cell section includes a predetermined number of memory cell transistors that are connected in series to one another with each of intermediate active layers acting as the source and drain of adjacent memory cell transistors. Each memory cell transistor may be a floating-gate metal oxide semiconductor field effect transistor having an insulated gate (floating gate) for storing electrical charge carriers therein and a control gate coupled to a corresponding word line.

The NAND cell array is arranged either in a P type silicons substrate or in a P type well region formed in an N type silicon substrate. A memory cell transistor positioned at the first and of each NAND cell section has a drain coupled to a corresponding bit line by way of a first select transistor. The source of another memory cell transistor that is at the opposite end of the NAND cell section is coupled to a common source voltage (a reference potential wiring line) through a second select transistor. The control gate electrodes of NAND memory cell transistors are connected to each other along the row direction to constitute word lines on the substrate.

The operation of the conventional NAND-cell type EEPROM arranged as described above is as follows. A data write for a selected cell section is carried out in such a manner that the memory cell transistors included therein are sequentially subjected to write operations with a memory cell transistor that is most distant from the memory cell transistor connected through the first select transistor to a corresponding bit line associated therewith (i.e., the memory cell transistor coupled to the common source potential through the second select transistor) being as a starting cell transistor. A boosted high voltage Vpp (20 volts, for example) is applied to the control gate of a memory cell transistor being presently selected for write. An intermediate voltage VppM (such as 10 volts) is applied to the select gate and the control gate(s) of one or those of the memory cell transistors which are positioned between the selected cell transistor and the first select transistor, thereby to render these transistors conductive. A zero-volt voltage or the intermediate voltage VppM is applied to the corresponding bit line in accordance with the logic value of the write data.

When the zero-volt voltage is applied to the bit line, a resultant potential thereon is transferred to the drain of the presently selected memory cell transistor through the transistors being rendered conductive. Electrons are thus injected from the drain into the floating gate of the selected cell transistor. The threshold voltage of it is thus shifted positively. This positive shift condition is defined as a logic "1" storage state. Alternatively, when the intermediate voltage VppM is applied to the bit line, the injection of electrons does not take place, so that the selected cell transistor is kept unchanged in its threshold voltage. This condition is defined as a logic "0" storage state.

A data erase is carried out so that all the memory cell transistors included in the NAND-cell type EEPROM are erased at a time. More specifically, while the control gates and the first and second select gates are set at the zero volts, (1) the bit lines and the common source line are rendered electrically floating, and (2) the high voltage Vpp is applied to the P type substrate (or both the P type well region and the N type substrate). As a result, electrons accumulated in the floating gates are released to the P type substrate (or to the P type well region) in all the memory cell transistors, causing the threshold voltages of them to be shifted negatively.

A data read is performed by detecting whether or not a current flows in a selected memory cell transistor while causing the control gate of the selected cell transistor to be at zero volts, and applying a power supply voltage Vcc (5 volts, for example) to the control gates of the remaining memory cell transistors and the select gates.

As is apparent from the above explanation, according to the presently available NAND-cell type EEPROM, the non-selected memory cell transistors act as "transfer gates" that allow the write data to be transferred to or from the selected memory cell transistor during the write and read periods. From this viewpoint, the following inevitable restriction is put on the setting of an allowable range of the threshold voltage of the once-written memory cell transistor: The threshold voltage of a memory cell transistor being written with a logic "1" should range from 0.5 to 3.5 volts. By taking into account the deterioration with age in the threshold voltage after the completion of data write, possible deviations in the manufacturing parameters of the memory cell transistors, a potential variation of the power supply voltage Vcc, and so on, it is required in practical applications to practice that the allowable variation range of the threshold voltage is so designed so as to be narrower than the above.

However, with a conventional write scheme using a fixed writing potential and a fixed writing time with respect to all the memory cell transistors to cause them to be written under the same conditions, it is not easy to force the threshold voltage variation after writing of a logic "1" to fall within the limited allowable range. For example, the memory cell transistors may vary in physical property due to some variations that possible occur in the manufacturing processes. Regarding the write characteristic, this results in that easy-to-write cells and difficult-to-write cells coexist in the NAND cell section. To facilitate to attain a successful programming for such cells different in write characteristic from one another, a specific "variable write-time/verify" programming architecture has been proposed which includes a process of adjusting the writing time with respect to each memory cell according to its inherent write characteristic, and a process of checking or verifying the validity of the data once written into each cell. Unfortunately, the conventional NAND-cell EEPROM still cannot take the maximum advantages out of the advanced programming architecture while having the integration density higher than ever. The main reason for this is that the EEPROM is conventionally required to include two extra flip-flop circuits that are arranged at the both ends of each bit line to perform a data latch operation and a sense amplification operation. The number of such extra circuits will increase as the number of bits increases. The addition of the increased number of extra circuits leads to an undesirable increase in the occupation area of the internal circuitry of the EEPROM, causing its integration density to decrease.

SUMMARY OF THE INVENTION

It is therefore an object of the present invention to provide a new and improved electrically erasable and programmable semiconductor memory device that can attain a higher integration density and a higher reliability.

It is another object of the present invention to provide a new and improved electrically erasable and programmable semiconductor memory device that enables the threshold voltage variation of a once-written memory cell to fall within a limited allowable range while maintaining an increased integration density of memory cells.

In accordance with the above objects, the present invention is drawn to a specific electrically erasable and programmable non-volatile semiconductor memory device, which includes a semiconductive substrate, a plurality of bit lines on the substrate, and an array of rows and columns of memory cells connected to the bit lines on the substrate. Each of the memory cells includes a transistor having an insulated carrier storage layer and a control gate electrode insulatively disposed above the carrier storage layer, wherein electrical charge carriers move by the tunnel effect to or from the carrier storage layer for a data write. A sense/latch circuit is coupled to the bit lines, for selectively performing a sense operation and a data latch operation for latching a write data. A program controller is provided for writing the write data into a selected memory cell or cells of the memory cells which are included in a designated area during a predetermined length of time period, for reading the contents of the selected memory cell or cells to verify whether or not a resultant threshold voltage thereof falls within a pre-determined range, and for, if an insufficiently written memory cell transistor is found, writing the write data again into the insufficiently written memory cell transistor. A data setter is provided for performing a logic operation with respect to a read data corresponding to the contents of the selected memory cell or cells and the write data being latched in the sense/latch circuit means, and for automatically updating a rewrite data being stored in the sense/latch circuit means with respect to every bit line in accordance with the actual write state as being presently verified. The sense/latch circuit includes a flip-flop circuit which remains as a latch circuit at the beginning of the verify operation, and functions as a sense amplifier circuit after being reset.

The foregoing and other objects, features and advantages of the invention will become apparent from the following more particular description of preferred embodiments of the invention, as illustrated in the accompanying drawings.

BRIEF DESCRIPTION OF THE DRAWINGS

FIGS. 3A and 3B illustrate two cross-sectional structures of the NAND cell section of FIGS. 2A and 2B along two intersecting lines A—A and B—B respectively.

FIG. 4 is a diagram showing the overall configuration of internal memory cells of the cell array of FIG. 1.

FIG. 5 is a diagram showing the internal arrangement of a bit-line control circuit of FIG. 1.

FIG. 6 is a timing diagram showing potential variations occurring at the main components of the embodiment during a read operation with respect to the even-numbered columns of the embodiment, and FIG. 7 is a timing diagram showing potential variations occurring at the main components during a read operation with respect to the odd-numbered columns of the embodiment.

FIG. 8 is a timing diagram showing potential variations at the main circuit components during write and verify-read operations of the embodiment, and FIG. 9 is a timing diagram showing potential variations at the main circuit components during rewrite and verify-read operations of the embodiment.

FIG. 13 is a diagram showing schematically the overall arrangement of a NAND-cell type EEPROM in accordance with a third embodiment of the present invention.

FIG. 16 is a timing diagram showing potential variations at the main components during a read operation with respect to the columns of a second memory cell block of the embodiment;

FIG. 19 is a diagram showing the arrangement of a memory cell matrix section of a NOR-type EEPROM in accordance with a fourth embodiment of the invention.

FIGS. 22 to 24 are diagrams showing three possible circuit configurations that are preferably used in the above-mentioned NAND-cell type EEPROMs.

FIG. 25A is a diagram showing an exemplary circuit configuration of a drive circuit for boosting the potentials of signals, which is preferably employed in a case wherein the concept of the present invention is applied to an EEPROM operative under a decreased power supply voltage therefor, and FIG. 25B is a timing diagram of the embodiment shown in the preceding figure.

FIG. 29 is a timing diagram showing potential variations at the components during a write operation.

FIGS. 34A and 34B illustrate flowcharts of the write and write-verify operations in the EEPROMs.

DETAILED DESCRIPTION OF THE PREFERRED EMBODIMENTS

Figure 1:
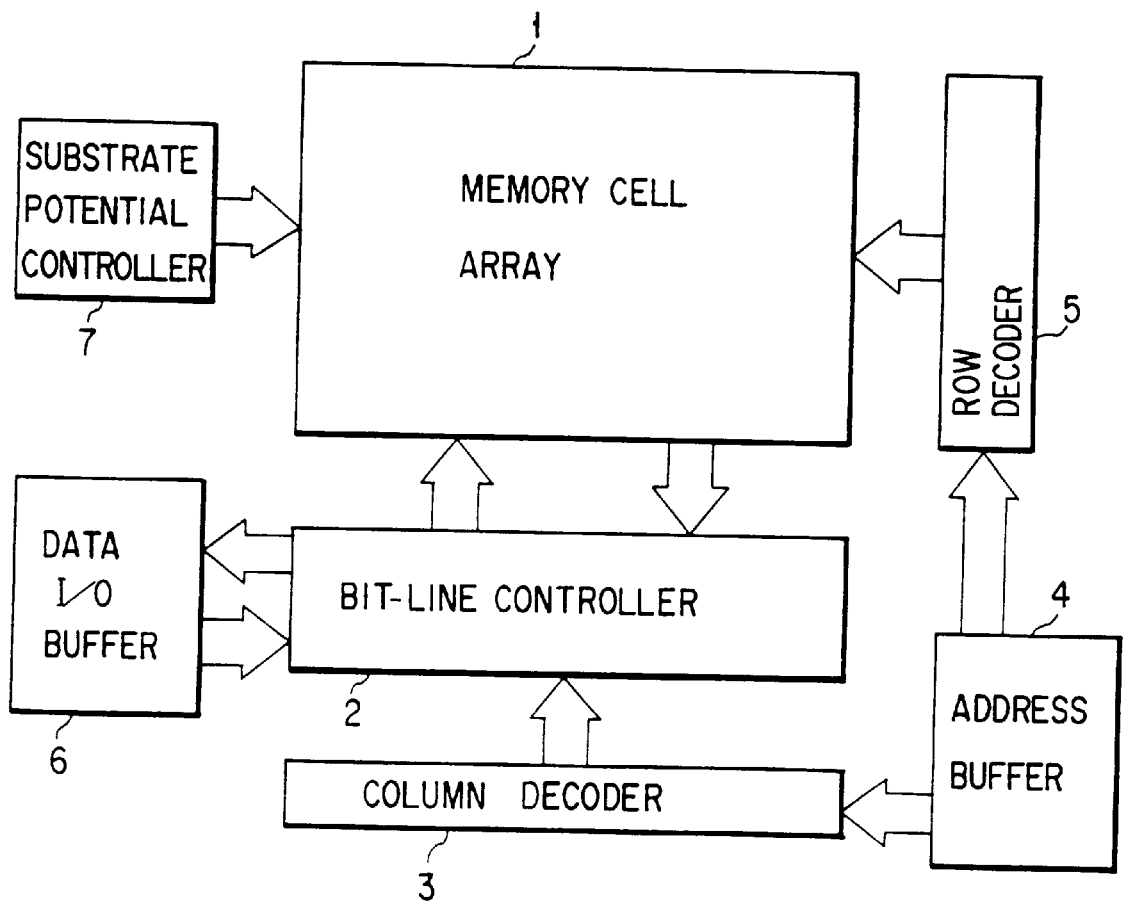
FIG. 1 is a diagram showing schematically the overall arrangement of a NAND-cell type electrically erasable and programmable read-only memory (EEPROM) in accordance with one preferred embodiment of the invention.

Referring now to FIG. 1, and electrically erasable and programmable read only memory (EEPROM) of the NAND cell type in accordance with one preferred embodiment of the present invention includes an array 1 of memory cells arranged in rows and columns. The memory cell array 1 is formed in a P type silicon substrate ("11" shown in FIGS. 3A and 3B). Memory cell array 1 may alternatively be arranged in a P type well region formed in an N type silicon substrate.

The memory cell array 1 is connected to a bit-line control circuit 2, which includes a sense amplifier circuit and a data latch circuit and which performs a write, a read, a rewrite and a verify operation for memory cell array 1. The bit-line control circuit 2 is connected to a column decoder 3. Column decoder 3 is coupled to an address buffer 4. Address buffer 4 supplies column decoder 3 with an address signal. Address buffer 4 is also connected to a row decoder 5 that is coupled to memory cell array 1. Row decoder 5 potentially controls the control gates and select gates of memory cell array 1.

The bit-line control circuit 2 is connected to a data input/output (I/O) buffer 6, and receives the output of the column decoder 3, which is responsive to an address signal supplied by address buffer 4. Memory cell array 1 is coupled to a substrate potential control circuit 7, which potentially controls the P type silicon substrate (or the P type well region in the N type silicon substrate).

The bit-line control circuit 2 essentially consists of a complementary metal oxide semiconductor (CMOS) flip-flop circuitry. Bit-line control circuit 2 is the circuit that carries out a latch operation for potentially latching a logic data to be written into a memory cell being presently selected, a sense operation for sensing a bit line potential to read a data, a sense operation for a verify-read after the write operation, and a latch operation for potentially latching a data to be rewritten (rewrite data) when any "insufficient write" is detected.

Figures 2A, 2B:
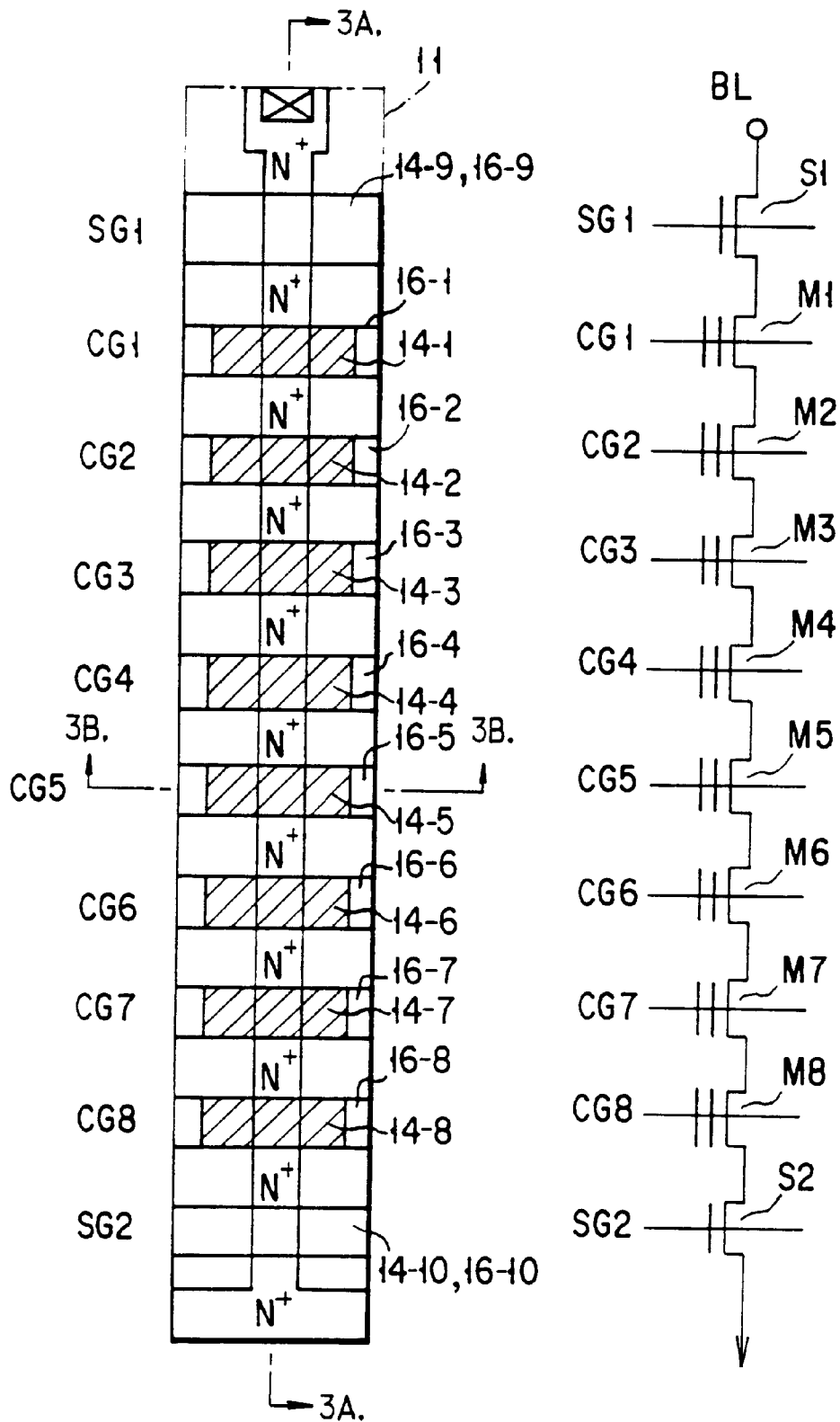
FIG. 2A shows a plan view of one NAND cell section included in a memory cell array of FIG. 1.
FIG. 2B is a diagram showing the equivalent circuit of the NAND cell section of the preceding figure.

The memory cell array 1 of FIG. 1 is divided into a plurality of cell sections, each of which includes a predetermined number of floating gate tunneling metal oxide semiconductor (FATMOS) field effect transistors M each constituting one "cell." With the embodiment, these "memory cell transistors" are assumed for purposes of explanation to be eight FATMOS transistors M1, M2, M3, . . . , M8. As shown in FIG. 2B, the memory cell transistors M are connected in series with one another in such a manner that an intermediate active region serves as both a drain of a cell transistor and a source of another cell transistor neighboring thereto, thereby provide a "NAND cell" structure. The cell section of FIG. 2A will be referred to as a "NAND cell section" hereinafter. The two different cross-sectional structures of the NAND cell section are shown in FIGS. 3A and 3B respectively.

As shown in FIG. 3A, the series circuit of memory cell transistors M1 to M8 are formed in the top surface of P type substrate 11 (or P type well region not shown), which is surrounded by an element-separation oxide film 12. Memory cell transistors M1–M8 have floating gate electrodes 14-1, 14-2, . . . , 14-8 electrically insulated by a dielectric film (gate insulation film) 13 from substrate 11, and control gate electrodes 16-1, 16-2, . . . , 16-8 insulated by another dielectric film 15. Heavily-doped N (N+) type diffusion layers 19 are formed in substrate 11 as the sources or drains of memory cell transistors M. Each of intermediate diffusion layers except the both side ones serves as the source and drain of adjacent memory cell transistors.

On the drain side of the series array of NAND cells, a first select transistor S1 is arranged which has two stacked gate gate layers 14-9, 16-9 being electrically coupled with each other. A second select transistor S2 is provided on the source side of the NAND cell array to have gate layers 14-10, 16-10 that are electrically coupled with each other. Memory cell transistors M and the first and second select transistors S1, S2 are covered by a CVD dielectric film 17, on which a metallic wiring layer 18 is disposed to constitute a bit line BLi (i=0, 1, 2, . . . ). As shown in FIG. 3A, bit line layer 18 is coupled through a contact hole formed in CVD dielectric film 17, to one diffusion layer 19 acting as one of the current-carrying electrodes of first select transistor S1.

the control gate electrodes 16 of each subarray of memory cell transistors M along the column direction are connected together to provide an elongate control gate wiring layer CGj (j=1, 2, . . . 8) shown in Fig. 3B. The resultant parallel control gate wiring layers CG1, CG2, . . . , CG8 constitute word lines of the EEPROM. Similarly, the mutually-connected select gates 14-9, 16-9 of the first select transistor S1 constitute a select gate line that extends in the row direction; the mutually-connected select gates 14-10, 16-10 of the second select transistor S2 constitute another select gate line extending in the row direction. The overall arrangement of the memory cell array section 1 including a plurality of similar NAND cell sections is illustrated in FIG. 4, wherein "vs" is used to designate a common source potential of the EEPROM.

The detailed internal circuit configuration of the bit-line controller 2 of FIG. 1 is shown in FIG. 2, wherein bit-line controller 2 includes a flip-flop circuit FF, which is arranged so that one flip-flop circuit is associated with two adjacent ones (BL2i and BL2i+1) of the parallel bit lines BL. Flip-flop circuit FF is a circuitry that performs a data-latch function and a data sense/amplification function. Such latch/ sense-amplifier circuit may perform different functions in response to control signals Vsn, Vsp so that it functions as a data latch circuit during a designated time period, and alternatively serves as a sense amplifier circuit during the other time period.

The flip-flop circuit FF is a complementary MOS (CMOS) flip-flop circuitry being comprised of enhancement-type (E-type) P-channel metal oxide semiconductor field effect transistors (MOSFETs) Qp1, Qp2 and E-type N-channel MOSFETs Qn5, Qn6, which are cross-coupled to MOSFETs Qp1, Qp2 as shown in FIG. 5. CMOS flip-flop circuit FF has two circuit nodes N1, N2, which are coupled to bit lines BL2i (i+0, 1, 2, . . . ), BL2i+1 by way of E-type N-channel MOSFETs Qn7, Qn8, respectively. N-channel MOSFETs Qn7, Qn8 perform switching operations in response to control signals $\phi$A, $\phi$B, respectively, thereby CMOS flip-flop circuit FF to be selectively connected to corresponding bit lines associated therewith or to be disconnected therefrom.

As shown in FIG. 5, the bit lines BL2i, BL2i+1 are provided with transistor circuits respectively. A series circuit of E-type N-channel MOS transistors Qn9, Qn10 is coupled between the bit line and the power supply voltage Vcc. A series circuit of E-type N-channel MOS transistors Qn11, Qn12 is coupled between the bit line BL2i+1 and the power supply voltage Vcc. The gate electrode of MOS transistor Qn10 is controlled by the potential at one (N1) of the nodes N1, N2 of the CMOS flip-flop circuit FF, the gate of MOS transistor Qn11 is controlled by the other (N2) thereof. The gates of the remaining MOS transistors Qn9, Qn12 are supplied respectively with verify-read signals $\phi$AV, $\phi$BV, which go high during a verify-read period. Either bit line BL2i or bit line BL2i+1 may be potentially charged, by a corresponding transistor circuit associated therewith, toward a potential level that is less than the power supply voltage Vcc by the threshold voltage Vth of a corresponding E-type N-channel transistors, i.e., Vcc-Vth. The bit lines BL2i, BL2i+1 are also provided with E-type N-channel MOS transistors Qn13, Qn14 respectively. These transistors are precharging transistors responsive to precharge control signals $\phi$PB, $\phi$PA, respectively.

E-type N-channel MOS transistors Qn3, Qn4 are provided for equalizing the two nodes N1, N2 of the CMOS flip-flop circuit FF in response to an equalize control signal $\phi$E. E-type N-channel MOS transistors Qn1, Qn2 are connected between the CMOS flip-flop circuit FF and a pair of input/output lines I/O, $\overline{\text{I/O}}$. The transistors Qn1, Qn2 serve as transfer gates that are responsive to a column select signal CSLi and cause flip-flop FF to be selectively coupled to the I/O line pair to perform a data input/output operation.

A voltage Vsw shown in FIG. 5 is the potential at an N type well region in which the P-channel MOS transistors Qp1, Qp2 of the CMOS flip-flop circuit FF are formed. The voltage Vsw is normally same in potential as the power supply voltage Vcc; voltage Vsw is at an intermediate voltage Vm (10 volts, for example) during a write period. A voltage Vsp to be applied to the common source node of P-channel MOS transistors Qp1, Qp2 remains at the potential level of power supply voltage Vcc. Voltage Vsp drops down to the intermediate voltage Vm during the write period, and changes temporarily at a different potential level equal to the half of the power supply voltage, i.e., Vcc/2 (=2.5 volts), during a read period. A voltage Vsn to be applied to the common source node of the N-channel MOS transistors Qn5, Qn6 is zero volts. The common source voltage Vsn rises at the Vcc/2 temporarily. The potentials of precharge signal Vsa, Vsb are as follows: When the bit line BL2i is selected during a read period, voltage Vsa is at about 3 volts, while voltage Vsb is Vcc/2. When the bit line BL2i+1 is selected during the read period, voltage Vsa is at Vcc/2, and voltage Vsb is 3 volts. During a write period, the voltages Vsa, Vsb are at the intermediate potential Vm. These voltages are zero volts when the bit lines are reset after the completion of write and erase operations.

The operation of the EEPROM arranged as described above is as follows. When the EEPROM is set in a read mode, the signals $\phi$A, $\phi$B are at the low ("L") level as shown in FIG. 6, thus causing the CMOS flip-flop circuit FF to be electrically disconnected from the bit lines BL. The precharge signals $\phi$PA, $\phi$PB go high ("H" level) so that the bit lines are precharged. Note that, with the present embodiment, the even-numbered ones (even bit lines) BL2i of the bit lines BL are first selected during the first half of the read period as shown in FIG. 6, and that the odd-numbered ones (odd bit lines) BL2i+1 are then selected during the second half of the read period as shown in FIG. 7.

Applying the precharge signals $\phi$PA, $\phi$PB causes each of the even bit lines BL2i to be precharged up to 3 volts and causes each of the odd bit lines BL2i+1 to be precharged at zero volts. After the precharge is completed, voltage $\phi$PA drops at the "L" level, causing the even bit line BL2i to be electrically floating. Thereafter, the row decoder 5 generates a desired voltage, which is supplied to the select gates and the control gates of the memory cell array section 1. For purposes of explanation, the second control gate CG2 is assumed to be selected from among the control gates CG of FIG. 4. Under such a condition, the selected control gate CG2 is at zero volts, the remaining control gates CG1, CG3 to CG8 are at voltage Vcc with the first and second select gates SG1, SG2 being set at Vcc. If the data stored in a selected memory cell transistor M2 is "1," the threshold voltage of it is positive, so that no current flows. The potential on bit line BL2i remains at 3 volts. Alternatively, if the cell storage data is "0", a cell current begins to flow, causing bit line BL2i to potentially drop down to 2.5 volts or less.

All the control gates CG and the select gates SG1, SG2 are then reset to zero volts. The voltage Vsb is at Vcc/2 (=2.5 volts), causing bit line BL2i+1 to be precharged to 2.5 volts. The CMOS flip-flop circuit FF is then equalized when (1) a signal $\phi$E being supplied to the gates of MOS transistors Qp3, Qp4 of FIG. 5 is changed to the "H" level, and (2) the signals Vsp, Vsn are at 2.5 volts. Thereafter, the signals $\phi$A, $\phi$B go high, causing CMOS flip-flop circuit FF to be connected to bit lines BL2i, BL2i+1. When Vsp is at Vcc, and when Vsn is zero volts, the bit line voltages are sensed differentially to provide a read data voltage, which is read externally and is latched continuously.

When the column select signal CSLi goes high, the read data is output to the I/O lines, is transmitted to the data input/output (I/O) buffer 6, and is then taken out of it externally. Note that the operations in the case of selection of the odd bit line BL2i+1 are similar to the aforementioned operations with the potential changes in the voltages $\phi$A, $\phi$PB and Vsa being replaced by $\phi$B, $\phi$PB and Vsb, respectively.

A write operation is performed as follows. The timing diagrams of FIGS. 8 and 9 are pulsing sequences at the main components of the embodiment during write, verify-read, rewrite, and verify-read operations, excluding a loading operation of the write data of the bit-line controller 2 from the data I/O buffer 6, under an assumption that the even bit lines BL2i are selected. Before the execution of a write operation, all the memory cell transistors M are erased simultaneously at a time (block erase operation) in such a manner that a zero-volt voltage is applied to the control gates of all the memory cell transistors M while the P type substrate (or both the N type substrate and the P type well region formed therein) is at the boosted high-level voltage Vpp (20 volts, for example). After the write data is supplied from the data input/output buffer 6 to the CMOS flip-flop FF through the I/O lines and latched therein, the precharge signals φPA, φPB are set at the intermediate potential Vm; then, the voltages Vsa, Vsb, Vsp, Vsw are at Vm. All the bit lines BL are at Vm-Vth. The two nodes N1, N2 of CMOS flip-flop FF are at either zero volts or Vm depending on the logic value of the write data.

When the signal φA is changed at the intermediate potential Vm, the bit line BL2i changes in potential in accordance with the logic value of write data: The bit line potential is Vm when the data is "0"; when the data is "1", the bit line potential is at zero volts. Assume that the control gate CG2 is selected by the row decoder 5 from the control gates CG shown in FIG. 4. The selected control gate CG2 is set at Vpp, and the remaining control gates CG1, CG3 to CG8 are at Vm. At this time, the first select gate SG1 is at Vm, whereas the second select gate SG2 is at zero volts.

After a predetermined length of time has elapsed, the control gates CG1 to CG8 and the select gate SG1 are reset to zero volts. The signal φA is then at zero volts, causing the even bit line BL2i to be disconnected from the CMOS flip-flop circuit FF. When the signals Vsa, Vsm drop down to zero volts, and when the signals φPA, φPB are at Vcc, all the bit lines BL are then reset to zero volts. The voltages Vsp, Vsw are at Vcc.

After the write operation, a read for write-verify (verify-read) operation is performed. The verify-read operation is basically similar to an ordinary read operation with a zero-volt voltage applied to a selected control gate being replaced by a 0.5-volt voltage, and with a verify signal φAV being used. Firstly, the precharge signal φPA is changed at 5 volts, causing bit line BL2i to be precharged to 3 volts. When precharge signal φPA is at the "L" level, bit line BL2i is rendered electrically floating. The control gates and the select gates are selectively activated by the row decoder 5 so that the control gate CG2 as being presently selected is at 0.5 volts, for example, and that the first select gate SG1 and the remaining control gates CG1, CG3 to CG8 are at Vcc. While a "1" can be correctly read if the threshold voltage of memory cell transistors is higher than zero volts in a normal read mode, it may possibly occur in the verify-read mode that a "1" cannot be read unless the threshold voltage is 0.5 volts or more.

Thereafter, the voltage Vsb is at 2.5 volts (=Vcc/2), and the odd bit line BL2i+1 changes at 2.5 volts accordingly. The even bit line BL2i is precharged to the voltage Vcc-Vth in response to the verify signal φAV, if a logic "0" has been written. The equalize signal φE goes high. The voltages Vsp, Vsn are at 2.5 volts, causing the CMOS flip-flop circuit FF to be reset. With this reset, CMOS flip-flop circuit FF, which has been functioning as a data-latch circuit, may "transform" to a sense amplifier. (A necessary data-latch may be performed by a parasitic capacitance or stray capacitance that is inherently present in a wiring line coupled to the bit line.) Thereafter, the signals φA, φB are at the "H" level, causing nodes n1, N2 to be connected to bit lines BL2i, BL2i+1 respectively. The voltage Vsp is changed at Vcc, and the voltage Vsn is at zero volts. A data on bit line BL2i is read out. The read data is then latched. The latched data will be used as a "rewrite" data later. This rewrite data (data to be given to an insufficiently written memory cell transistor if any is converted from a memory cell data obtained during the verify-read period on the basis of the write data as previously used. A conversion table for rewrite data is shown below.

TABLE 1

| Write Data | 1 | 1 | 0 | 0 |
| Cell Data | 0 | 1 | 0 | 1 |
| Rewrite Data | 1 | 0 | 0 | 0 |

The write operation including the verify-read and rewrite processes will be terminated after a combination of the verify-read and the rewrite is repeated for a predetermined number of times. The repeat value may be one hundred, for example. With such verify-read/rewrite scheme, after a "1" is written, if a data actually read out of the same memory cell transistor is "0," it should be determined that the cell transistors is an insufficiently written cell, which will be rewritten with the "1" data. In other words, whenever the threshold voltage of any once-written cell transistor is not more than 0.5 volts, additional "1" write operation is performed therefor in order to raise the threshold voltage. After the execution of such addition writing or rewriting of the data "1," if the memory cell data is "1," a "0" is rewritten. This means that, if a memory cell transistor is found to have its threshold voltage higher than 0.5 volts, a "0"-write is carried out with respect to such cell transistor during the rewrite period, to thereby eliminate any further increase in the threshold voltage of it. A "0"-rewrite follows a "0"-write, that is, a rewriting of "0" is automatically performed with respect to any one of the memory cell transistors that have been written with a "0". More specifically, only when the threshold voltage of a "1"-written cell transistor is lower than 0.5 volts, the "1" is written again thereinto, thereby to enable any "1"-written cell transistor to be suppressed or prevented from being further increased undesirably.

The pulsing sequences of the control gates CG1 to CG8 and the select gates SG1, SG2 during the erase, write, verify-read, read operations are indicated in Table 2 presented below. Note that the table contents assume that the control gate CG2 is selected with the even bit line BL2i being selected. Also note that "FLT" is used to represent the floating condition.

TABLE 2

| Line | Erase | Write "1" | Write "0" | Read | Verify |
|---|---|---|---|---|---|
| Bit Line BL2i | FLT | 0 V | 10 V | 3 V | 3 V |
| Bit Line BL2i + 1 | FLT | 10 V | 10 V | 2.5 V | 2.5 V |
| Select Gate SG1 | 20 V | 10 V | 10 V | 5 V | 5 V |
| Control Gate CG1 | 0 V | 10 V | 10 V | 5 V | 5 V |
| Control Gate CG2 | 0 V | 20 V | 20 V | 0 V | 0.5 V |
| Control Gate CG3 | 0 V | 10 V | 10 V | 5 V | 5 V |
| Control Gate CG4 | 0 V | 10 V | 10 V | 5 V | 5 V |
| Control Gate CG5 | 0 V | 10 V | 10 V | 5 V | 5 V |
| Control Gate CG6 | 0 V | 10 V | 10 V | 5 V | 5 V |
| Control Gate CG7 | 0 V | 10 V | 10 V | 5 V | 5 V |
| Control Gate CG8 | 0 V | 10 V | 10 V | 5 V | 5 V |
| Select Gate SG2 | 20 V | 0 V | 0 V | 5 V | 5 V |

TABLE 2-continued

|        |       | Write |     |      |        |
|--------|-------|-------|-----|------|--------|
| Line   | Erase | "1"   | "0" | Read | Verify |
| Source Line | FLT   | 0 V   | 0 V | 0 V  | 0 V    |
| Substrate   | 20 V  | 0 V   | 0 V | 0 V  | 0 V    |

According to the EEPROM as described above, after a data is once written into each of the memory cell transistors M1 to M8 in the selected NAND cell section, the resultant threshold voltage of each cell transistor is checked or verified by causing this cell transistor to be applied by the bit-line controller 2 with the verify voltage of a predetermined potential level (for example, an intermediate voltage between the power supply voltage Vcc and the ground potential). If such verify test reveals the fact that a cell transistor or transistors are unsuccessful in data write, in other words, if any memory cell transistor or transistors whose threshold voltage remains unsuccessful in falling within the allowable range of a target value even after the execution of the data writing operation is found out in the NAND cell section, such "insufficiently written" cell transistor is additionally written (or rewritten) with the same data. Thereafter, the verify operation is performed again to verify whether or not the resultant threshold voltage is at the target level. The verify process will be repeated until the satisfactory results are obtained wherein the threshold voltages of all the memory cell transistors in the NAND cell section fall within the allowable range.

With the write-verify/rewrite scheme, it becomes possible, by repeating the write-verify and rewrite operations with the length of time required to effect a successful data write being shortened, to cause the memory cell transistors finally succeeded in data write to be limited in the distribution of threshold voltage so that resultant threshold voltages are all within the allowable range determined in accordance with the logic value of write data. This enables the EEPROM to be maximized in the performance and reliability of write operation.

Furthermore, according to the embodiment, the bit-line controller 2 is constituted by a specific circuitry that changes its function selectively or alternatively between the data latch and the sense amplification in response to the control signals Vsn, Vsp. The circuitry acts as a data latch circuit, and the same circuitry may function as a sense amplifier at a different time. The data-latch/sense-amplifier circuitry includes the CMOS flip-flop circuit FF, which is arranged in common for adjacent ones BL2i, BL2i+1 of the parallel bit lines BL. Employing such flip-flop circuit arrangement can allow the NAND-cell EEPROM to be minimized in the number of additional circuit components that will be required to achieve the write-verify/rewrite feature. In other words, the embodiment can attain successful write-verify/rewrite operations with its circuit scale being decreased to have substantially the same chip occupation area as that of a prior art having no write-verify function. Therefore, the EEPROM can attain an increased integration density.

Figure 10:
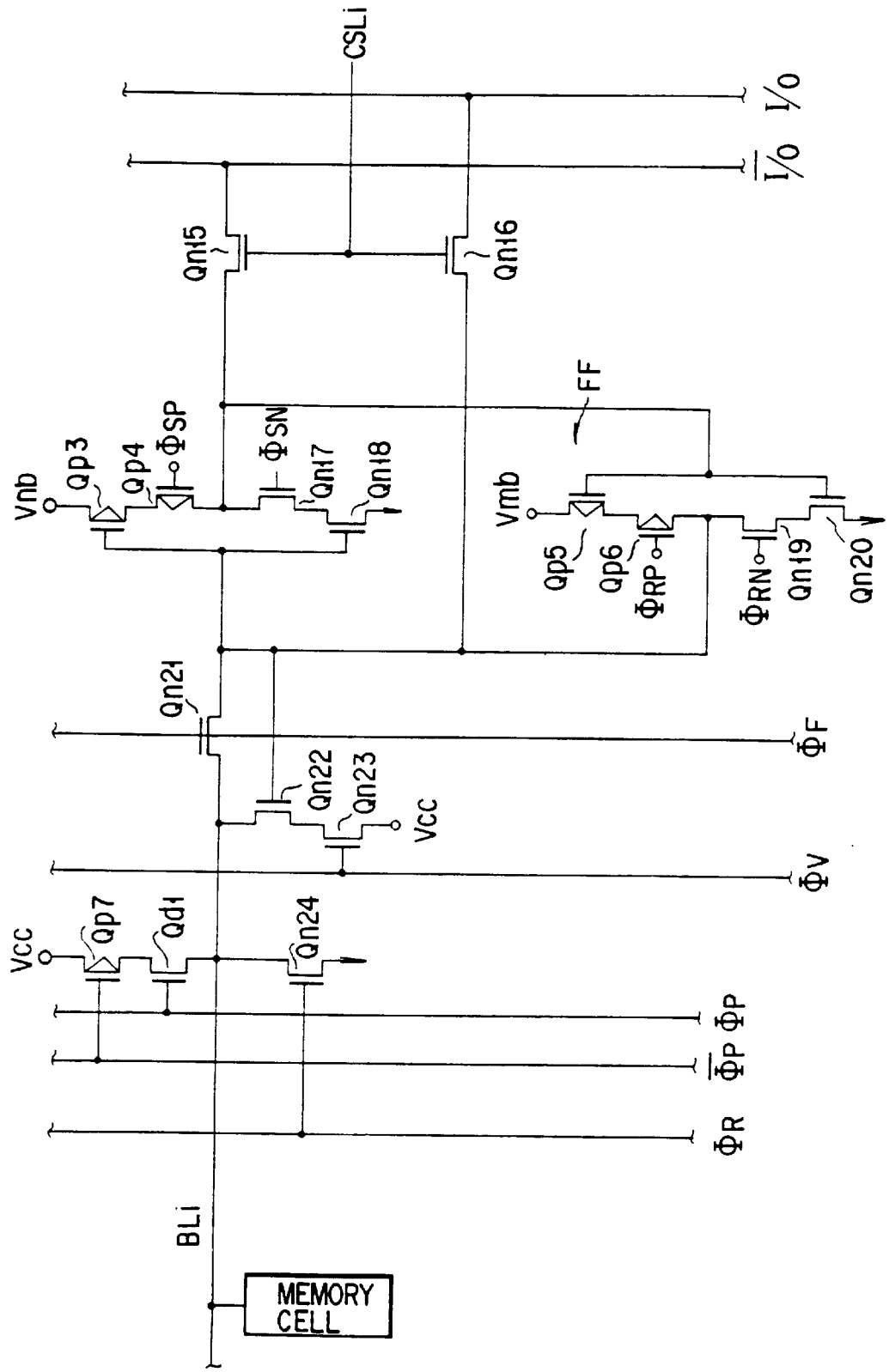
FIG. 10 is a diagram showing the circuit configuration of a modification of the bit-line control circuit which is utilized in a second embodiment of the invention.

In reduction to practice, the bit-line controller 2 of FIG. 5 may be modified as shown in FIG. 10, wherein the CMOS flip-flop circuit FF constituting the data-latch/sense-amplifier circuit of the present invention is arranged using a signal-synchronous CMOS inverter, which includes E-type P-channel MOSFETs Qp3, Qp4 and E-type N-channel MOSFETs Qn17, Qn18, and another signal-synchronous CMOS inverter including E-type P-channel MOS transistors Qp5, Qp6 and N-channel MOS transistors Qn19, Qn20. An N-channel MOS transistor Qn21 is connected between an output node of CMOS flip-flop circuit FF and bit line BLi. Transistor Qn21 performs a switching operation in response to a control signal φF being applied to the gate electrode thereof, causing CMOS flip-flop FF and bit line BLi to be selectively connected to each other.

A series circuit of an E-type N-channel MOS transistor Qn22 and an E-type N-channel MOS transistor Qn23 is coupled between the bit line BLi and the power supply voltage Vcc. Transistor Qn22 is responsive to the output node of the CMOS flip-flop circuit FF; transistor Qn23 is responsive to a control signal φV. These transistors are provided for precharging bit line BLi toward the voltage Vcc-Vth in accordance with a data in CMOS flip-flop FF during a verify-read period.

An E-type P-channel MOS transistor Qp7 and a depression-type (D-type) N-channel MOS transistor Qd1 are connected in series to each other to constitute a precharge circuit for precharging the bit line BLi to the power supply voltage Vcc. In the precharge circuit, transistor Qd1 is provided to prevent an undesirable high potential from being applied to transistor Qp7 during the erase operation and a write operation. An E-type N-channel MOS transistor Qn24 is connected to bit line BLi at its one current-carrying electrode. This transistor serves as a reset transistor that resets bit line BLi to zero volts. The two nodes of the CMOS flip-flop circuit FF are coupled to the I/O lines by way of E-type N-channel MOS transistors Qn15, Qn16 respectively. These transistors Qn15, Qn16 are transfer gates that are responsive to the column select signal CSLi.

Figure 11:
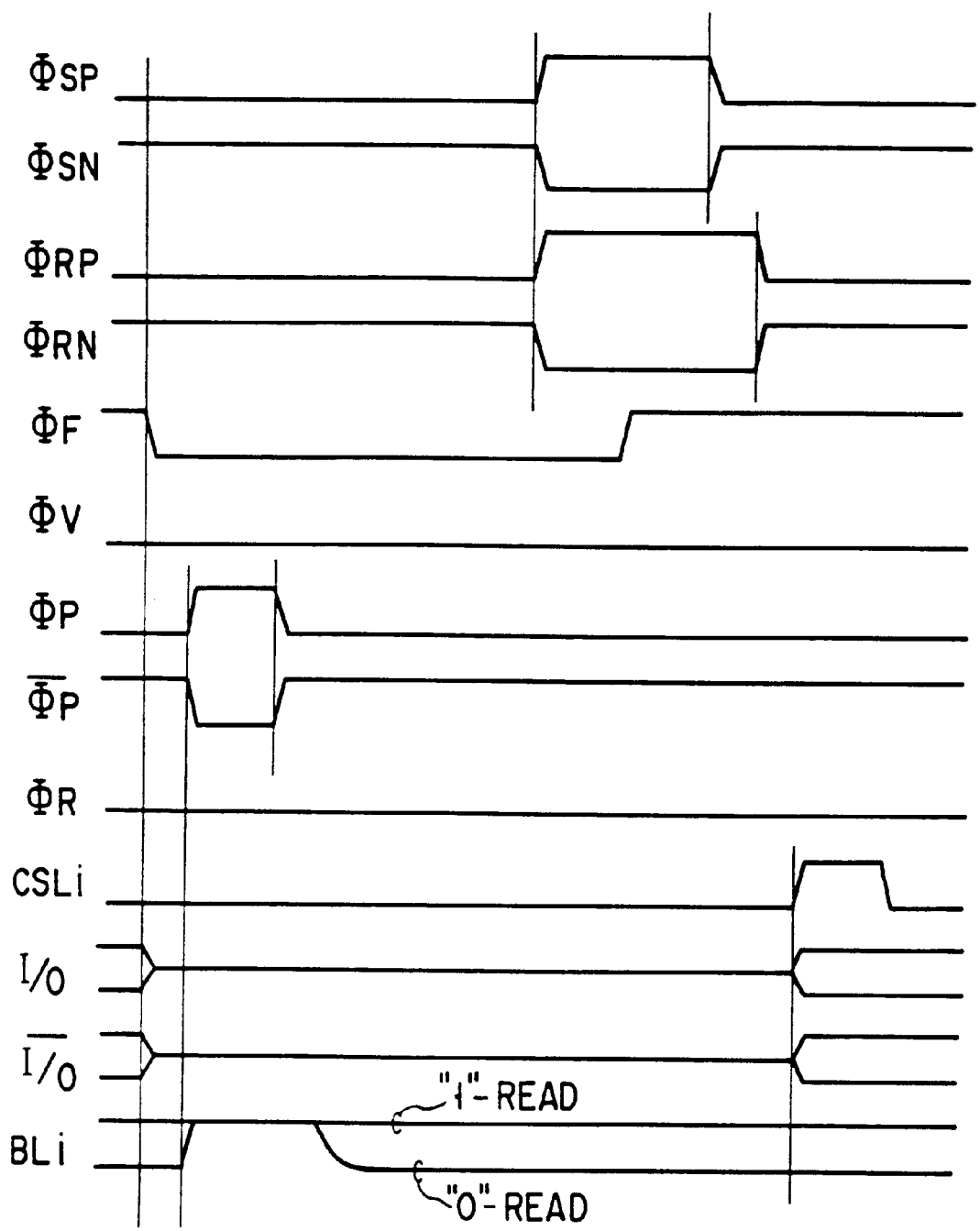
FIG. 11 is a timing diagram showing potential variations at the main circuit components of the second embodiment.

The bit-line controller shown in FIG. 10 operates as follows. The pulsing sequences of the bit-line controller are shown in FIG. 11. When the signal φF drops down to the "L" level, the bit line BLi is electrically disconnected from the CMOS flip-flop circuit FF. Bit line BLi is precharged to the power supply voltage Vcc when the precharge signals φP, $\overline{\phi P}$ are at the "H" and "L" levels respectively. Thereafter, the row decoder 5 activates the first and second select gates SG1, SG and the control gates CG1 to CG8. Assuming that the control gate CG2 is selected, the selected control gate CG2 is set at zero volts, and the select gates SG1, SG2 and the remaining control gates CG1, CG3 to CG8 are applied with the power supply voltage Vcc. If the memory cell data is a logic "0," bit line BLi is at the "L" level. If the data is "1," bit line BLi remains at the "H" level.

After the select gates SG and the control gates CG are reset to zero volts, the signals φSP, φSP rise to the "H" level, and signals φSN, φRN drop down to the "L" level, thus having the CMOS flip-flop circuit FF inactivated. The signal φF is then at "H" causing the resultant voltage on bit line BLi to be transferred to the output line of CMOS flip-flop FF. When φSP is at "L" and φSN is at "H," the potential on bit line BLi is sensed. The sensed potential is then latched when φRP is at "L" and φRN is at "H." The latched data is transferred to the I/O lines when the column select signal CSLi goes high potentially.

Figure 12:
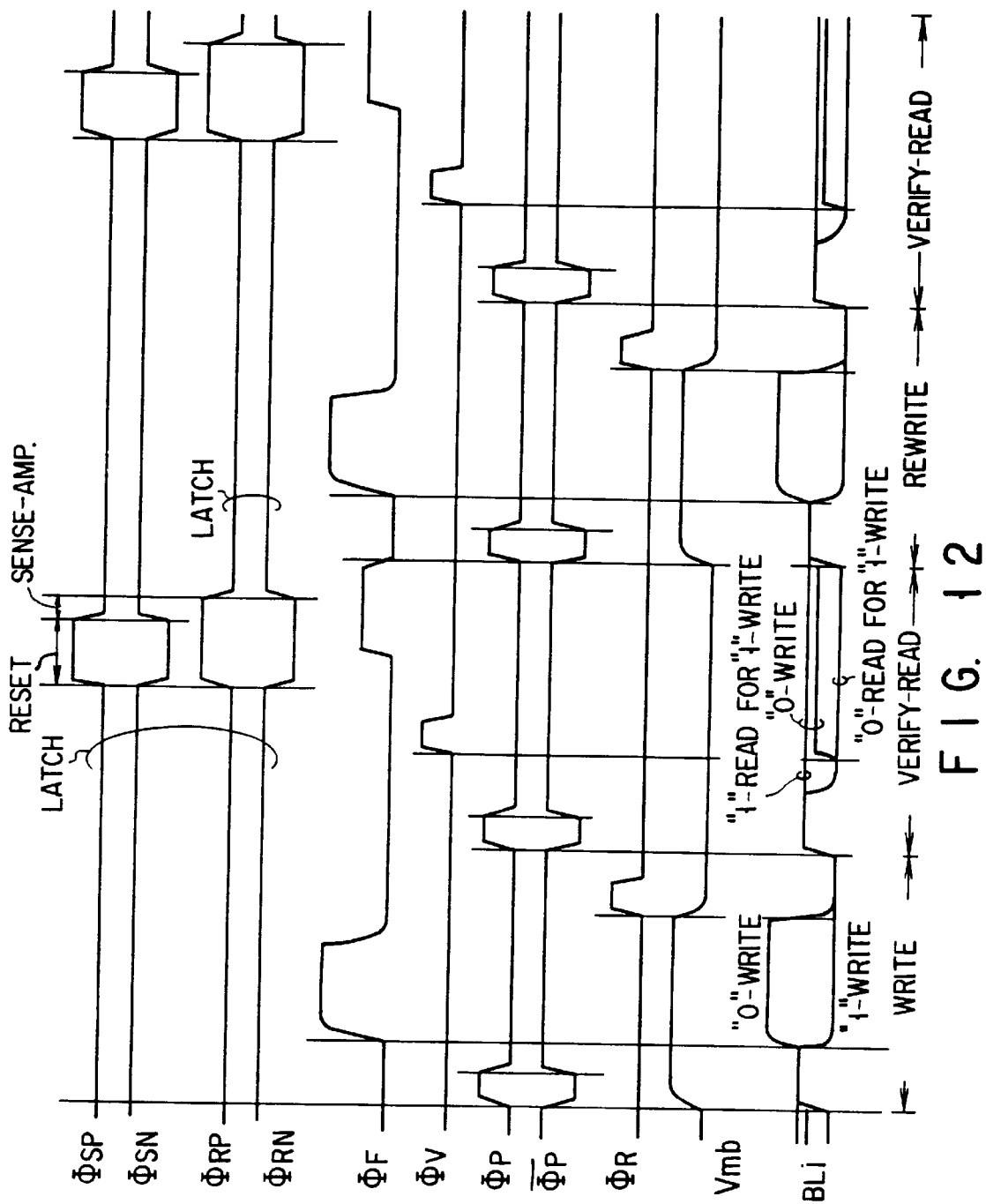
FIG. 12 is a timing diagram showing potential variations at the main components during write and verify operations.

Subsequently, a write/write-verify operation is carried out. The pulsing sequences during this period are illustrated in FIG. 12. After the write data is latched in the CMOS flip-flop circuit FF from the I/O lines, the precharge signal φP is at the "H" level, and precharge signal $\overline{\phi P}$ is at the "L" level. The bit line BLi is thus precharged. A voltage Vmb, which is applied to the P-channel MOS transistors Qp3, Qp5 of FIG. 10, is potentially changed from the power supply voltage Vcc to the intermediate voltage Vm(=10V). The signal φF is at Vm. The potential on bit line BLi changes at either zero volts or Vm in accordance with the logic value of the latched data. In the case of writing of a logic "1," bit line BLi is at zero volts; in the case of writing of a logic "0," bit line BLi is at Vm. At this time, the first select gate SG1 is at Vm, whereas the second select gate SG2 is at zero volts. The potentials on control gates CG are as follows: While the control gate GC2 is selected, the control gate CG1 is at Vm, the selected control gate CG2 is at the high-level voltage VPP(=20 volts), and the remaining control gates CG3 to CG8 are at Vm.

When the select gates SG1, SG2 and the control gates CG1–CG8 are reset to zero volts, the signal φF drops to the "L" level, and the signal φR is at the "H" level, causing the bit line BLi to be reset to zero volts. This means that the EEPROM is on standby for the initiation of a verify-read operation.

The following verify-read operation is essentially similar to an ordinary read operation to be performed in the NAND-cell type EEPROM. Firstly, the precharge signal φP is changed at the "H" level, and precharge signal $\overline{\phi P}$ is at the "L" level, thereby to precharge the bit line BLi toward the power supply voltage Vcc. The select gates SG and the control gates CG are then driven by the row decoder 5 as will be described below. After resetting these gates SG, CG, the verify signal φV goes high, so that the voltage Vcc-Vth appears on only one of the bit lines BL which has been written with a logic "0" data.

Thereafter, the signals φSP, φRP are at the "H" level. The signals φSN, φRN are at the "L" level. The signal φF is at the "H" level. When signal φSP is at "L" and signal φSN is at "H," the bit line potential is sensed. Then, signal φRP is at "L" and signal φRN is at "H," causing the rewrite data to be latched. The relation among the write data, the memory cell data and the rewrite data is same as shown in Table 1 indicated previously.

The write/write-verify mode will be completed after the above write/write-verify operations are repeated for one hundred times, for example. The potential changes on the bit line BLi, the select gates SG and the control gates CG during the erase, write, read and verify-read periods is shown in Table 3 presented below. Note here that Table 3 assumes that the control gate CG2 is selected.

TABLE 3

| Line | Erase | Write "1" | Write "0" | Read | Verify |
|---|---|---|---|---|---|
| Bit Line BLi | FLT | 0 V | 10 V | 5 V | 5 V |
| Select Gate SG1 | 20 V | 10 V | 10 V | 5 V | 5 V |
| Control Gate CG1 | 0 V | 10 V | 10 V | 5 V | 5 V |
| Control Gate CG2 | 0 V | 20 V | 20 V | 0 V | 0.5 V |
| Control Gate CG3 | 0 V | 10 V | 10 V | 5 V | 5 V |
| Control Gate CG4 | 0 V | 10 V | 10 V | 5 V | 5 V |
| Control Gate CG5 | 0 V | 10 V | 10 V | 5 V | 5 V |
| Control Gate CG6 | 0 V | 10 V | 10 V | 5 V | 5 V |
| Control Gate CG7 | 0 V | 10 V | 10 V | 5 V | 5 V |
| Control Gate CG8 | 0 V | 10 V | 10 V | 5 V | 5 V |
| Select Gate SG2 | 20 V | 0 V | 0 V | 5 V | 5 V |
| Source Line | FLT | 0 V | 0 V | 0 V | 0 V |
| Substrate | 20 V | 0 V | 0 V | 0 V | 0 V |

Attention should be directed to the fact that, while the threshold voltage verifying operation uses a 0.5 volt-voltage as its reference voltage in the above embodiments, the reference voltage may be modified in accordance with a possible threshold voltage distribution in the reduction to practice. Also, the time length assigned to the execution of one write operation may be modified as follows. If it is required more strictly that the resultant distribution in the finally obtained threshold voltages of a number of memory cell transistors is exactly maintained within a narrow range, the length of every write time should be shortened to increase the repeat value of the write/verify operations at shortened execution periods. In addition, while the above embodiments are directed to the NAND-cell type EEPROMs employing the tunnel injection effect, the present invention may also be applied to other types of NAND-cell EEPROMs, such as a "hot-electron" injecting NAND-cell EEPROM. The embodiment of FIG. 5 may be effective when the memory cell array section 1 of FIG. 1 is modified to have what is called the "open bit line" configuration.

A NAND-cell EEPROM in accordance with a third embodiment of the present invention shown in FIG. 13 is similar to that of FIG. 1 with the memory cell section being divided into two separate cell blocks 1A, 1B. The bit-line controller 2 is a common circuitry for the both cell blocks 1A, 1B.

Figure 14:
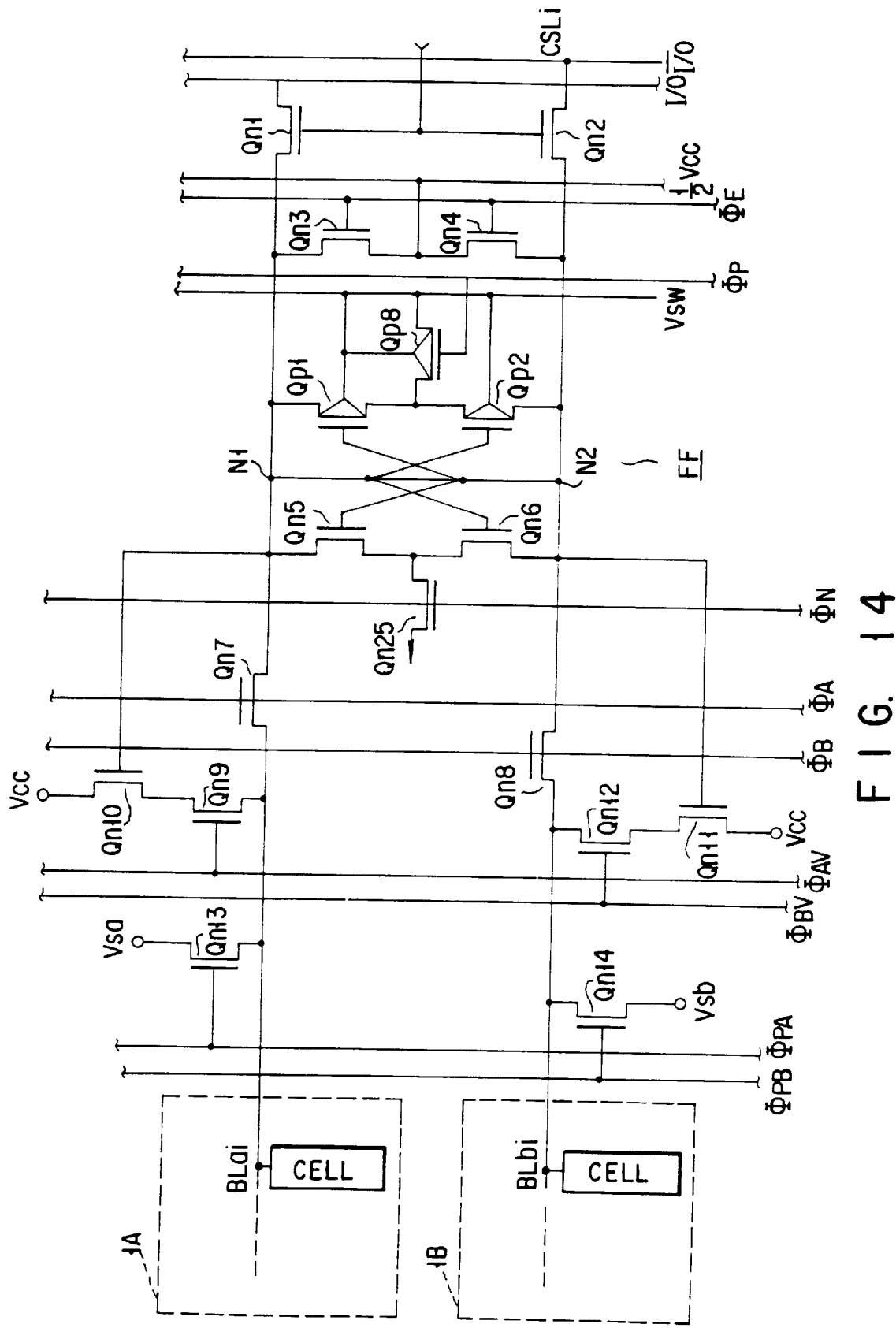
FIG. 14 is a diagram showing the internal circuit configuration of a bit-line control circuit of FIG. 13.

The bit-line controller 2 is arranged as shown in FIG. 14. This circuit configuration is basically similar to that shown in FIG. 5, except the following modifications. The nodes N1, N2 of CMOS flip-flop circuit constituting the data-latch/sense amplifier circuit are coupled to bit lines BLa of cell block 1A and those of cell block 1B by way of transfer-gate MOS transistors Qn7, Qn8. In FIG. 14, one of the bit lines BLa in cell block 1A is illustrated as "BLai" (i=0, 1, 2, . . . ) for purposes of illustration only. The same goes with the bit line BLbi (i=0, 1, 2, . . . ).

With the circuitry of FIG. 14, unlike that of FIG. 5, an N-channel MOS transistor Qn25 is arranged, as an activation transistor, at the common source node of the MOS transistors Qn5, Qn6 on the NMOS side of the CMOS flip-flop circuit FF. This transistor Qn25 is responsive to a clock signal φF, which is applied to the gate of it. On the PMOS side of flip-flop circuit FF, a P-channel MOS transistor Qp8 is arranged at the common source node of the transistor Qp1, Qp2 as another activation transistor.

Figure 15:
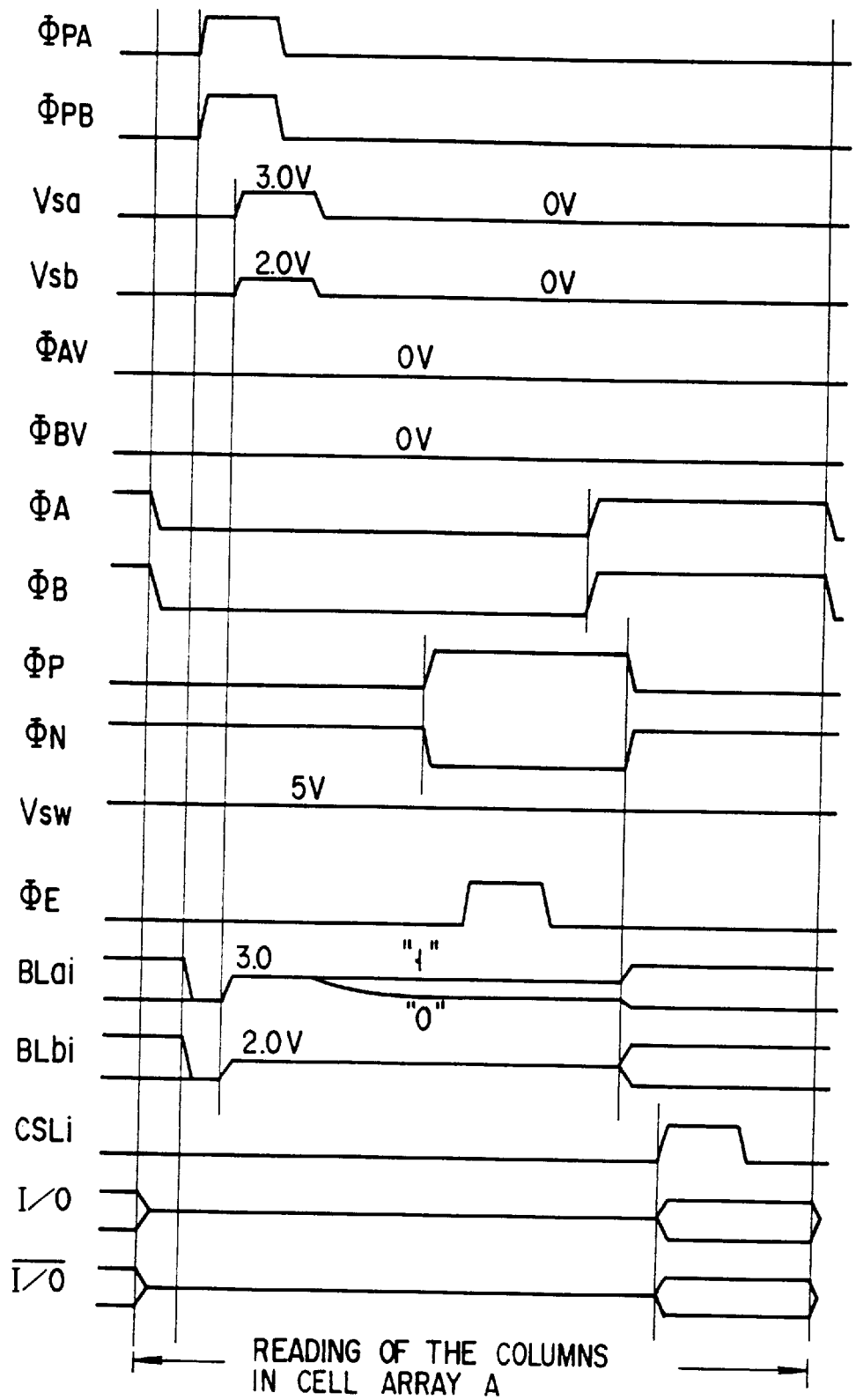
FIG. 15 is a timing diagram showing potential variations at the main circuit components of the third embodiment during a read operation with respect to the columns of a first memory cell block of the embodiment.
Figure 17:
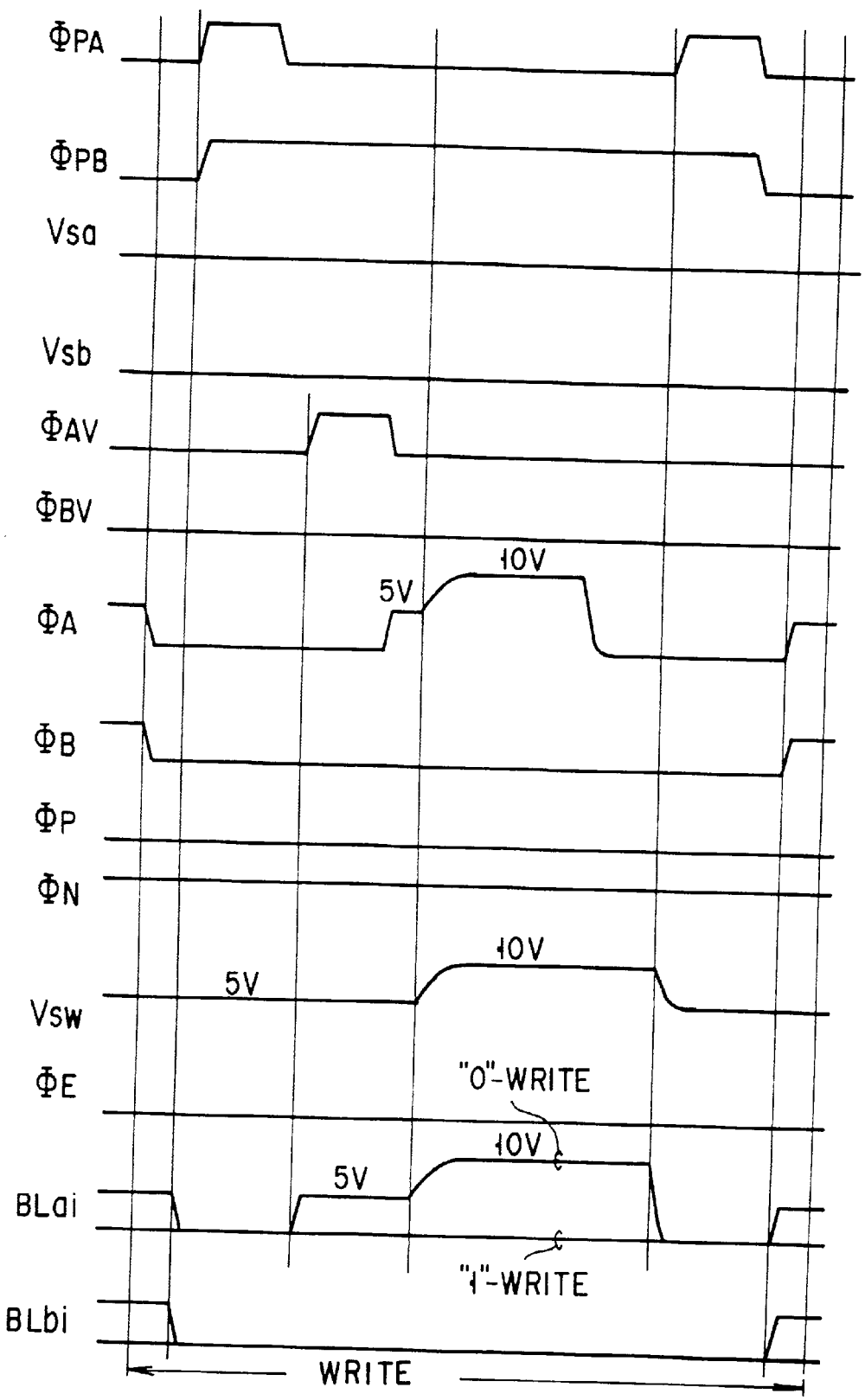
FIG. 17 is a timing diagram showing potential variations at the main components during a write operation.
Figure 18:
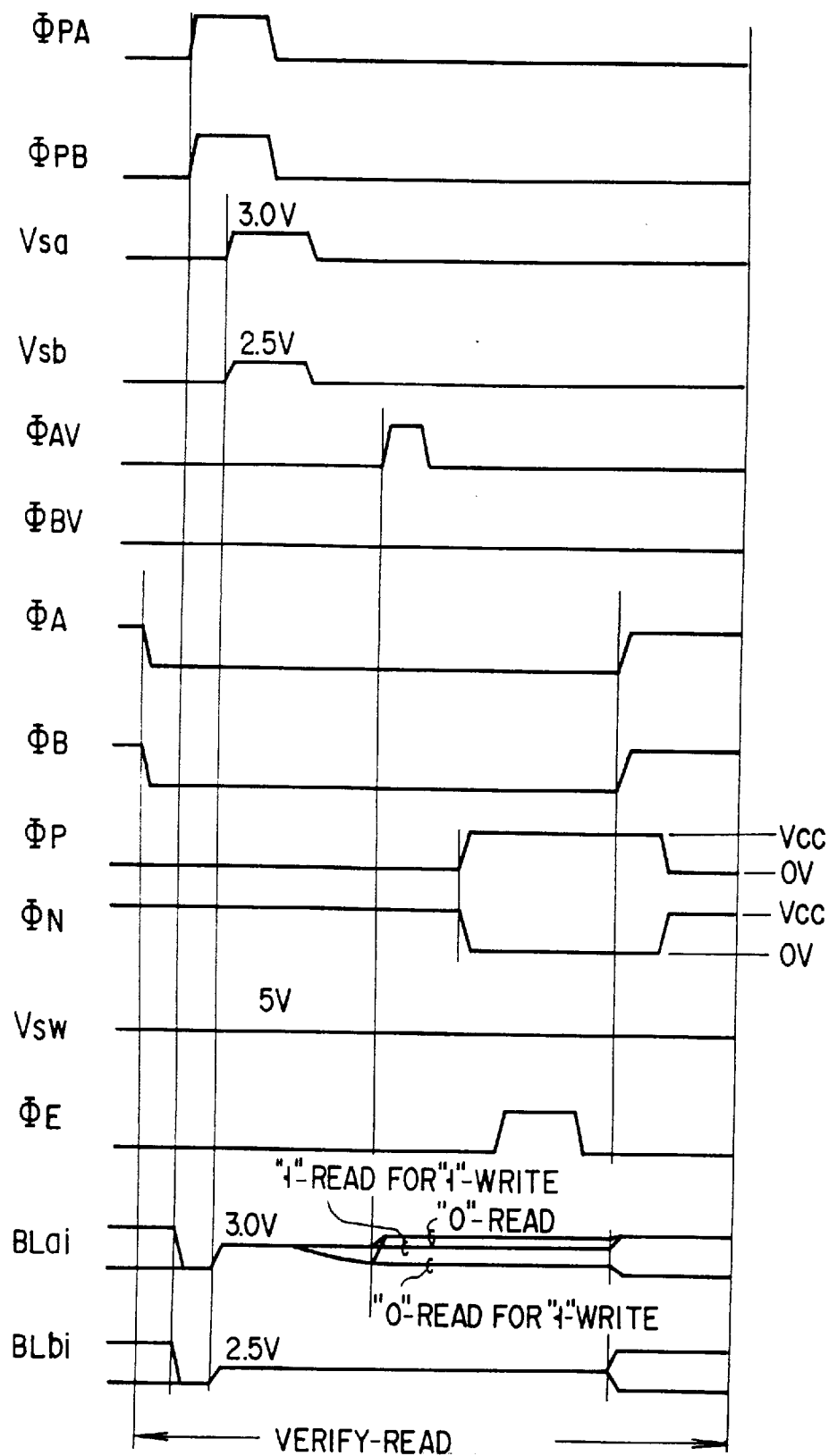
FIG. 18 is a timing diagram showing potential variations thereat during a verify operation of the third embodiment.

The operation of the EEPROM will be described with reference to FIGS. 15 to 18, wherein FIGS. 15 and 16 show the pulsing sequences of it during a read period, and FIGS. 17 and 18 illustrate the pulsing sequences during a write/write-verify period.

During a read period, the signals φA, φB drop at the "L" level, causing the bit lines BLai, BLbi to be electrically disconnected from the CMOS flip-flop circuit FF. When the precharge signals φPA, φPB go high, the bit lines are precharged. The example shown in FIGS. 15 and 16 assumes that the bit line BLai of the first cell block 1A is first selected, and that the bit line BLbi of the second cell block BLbi is then selected in a next read cycle. The first read cycle for bit line BLai will be explained below.

As shown in FIG. 15, the selected bit line BLai is precharged to 3 volts, and the non-selected bit line BLbi is precharged to 2 volts, in response to the precharge signals φPA, φPB. After the precharge operation is completed, signals φPA, φPB are at the "L" level. The bit lines BLai, BLbi are then rendered electrically floating. Thereafter, the row decoder 5 generates suitable voltages, which are supplied to the select gate SG and the control gates CG. For purposes of explanation, assume that the control gate CG2 is selected presently. In this case, row decoder 5 provides control gate CG2 with a zero-volt voltage, and applies the power supply voltage Vcc to the first and second select gates SG1, SG2 and the remaining control gates CG1, CG3 to CG8. If a logic "1" data has been stored in a memory cell transistor associated with control gate CG2, no current flows because the threshold voltage of such selected memory cell transistor is positive. The potential on bit line BLai thus remains at 3 volts. Alternatively, if the storage data is a logic "0," a corresponding cell current flows causing the potential on bit line BLai to decrease at 2 volts or less.

Subsequently, the signal φP rises to the "H" level, and the signal φN is at the "L" level. The signal φE is at the "H" level. The CMOS flip-flop circuit FF is then equalized. After the equalizing of flip-flop FF, signals φA, φB are at the "H" level, causing the bit lines BLai, BLbi to be electrically connected to flip-flop FF. When signals φP is at the "L" level, and when signal φN is at the "N" level, the bit line potential is sensed differentially to provide a read data, which is then latched. When the column select signal SCLi changes to the "H" level, the read data is output to the I/O lines, transferred to the data input/output buffer 6, and then taken out of it externally.

Thereafter, the bit line BLbi of the second cell block 1B is selected for a read. The read operation therefor is similar to that previously explained, with the operations of signals φPB, φP being replaced by each other, and φSA, φSB being replaced with each other.

When the EEPROM is set in a write mode, a write operation and a write-read operation therefor are performed as shown in FIGS. 17 and 18, wherein a data load operation of loading the write data of the bit-line controller 2 from the input/output buffer 6 is not shown. Note that the pulsing sequences shown in FIGS. 17 and 18 are obtained when the bit line BLai of the first cell block 1A is selected. Prior to a data write, an erase (block erase) operation is performed with respect to all the memory cells at a time in such a manner that the control gates of all the memory cell transistors M are set at zero volts, while the high-level voltage Vpp(=20 volts) is applied to the P type substrate (or the N type substrate and the P type well region formed therein). After the write data is transferred from the data input/output buffer 6 to the CMOS flip-flop FF through the I/O lines and latched therein, the precharge signals φPA, φPB are set at the "H" level, thereby to reset all the bit lines.

When the signals φA, Vsw are at the intermediate voltage Vm (=10 volts), the bit line BLai is potentially changed in accordance with the logic value of write data. If the data is a logic "0," the bit line voltage is at Vm; if the data is a logic "1," the bit line voltage is at zero volts. Assuming that the control gate CG2 is selected, this control gate GC2 is set at zero volts, while the select gates SG and the remaining control gates CG1, CG3 to CG8 are at Vm.

After the elapse of a predetermined length of time (40 microseconds, for example), the select gates SG1, SG2 and the control gates CG1 to CG8 are reset, and then the signal φA is at zero volts. This disconnects the bit line BLai from the CMOS flip-flop circuit FF. When the signal φPA is at the "H" level, all the bit lines are reset. The signal Vsw becomes at the power supply voltage Vcc.

A read operation for a write-verify (write-verify read operation) is then performed. Like the above-mentioned embodiment, a 0.5-volt voltage in stead of the 0-volt voltage is applied to the selected control gate, and the verify signal φAV is generated. The bit line BLai is precharged to 3 volts; the bit line BLbi is precharged to 2 volts. Thereafter, the precharge signals φPA, φPB drop to the "L" level, causing bit lines BLai, BLbi to be electrically floating. The select gates and the control gates are selectively activated by the row decoder 5 such that the selected control gate CG2 is set at 0.5 volts, while the select gates SG1, SG2 and the remaining control gates CG1, CG3 to CG8 are at the power supply voltage Vcc. While a "1" may be read correctly if the threshold voltage of memory cell transistors is higher than zero volts in a normal read mode, it may possibly occur in the verify-read mode that a "1" cannot be read unless the threshold voltage is 0.5 volts or more.

Thereafter, the bit line BLai is charged to the voltage Vcc-Vth in response to the verify signal φAV, if a logic "0" data has been written. The potential level of the precharge voltage performed by the verify signal in this case may be higher than that of the selected bit line. After the CMOS flip-flop FF is reset in response to the equalize signal φE, the signals φA, φB rise at the "H" level, causing the nodes N1, N2 to be coupled to bit lines BLai, BLbi respectively. The signal φP potentially changes at the "L" level, whereas signal φN changes to the "H" level. A data voltage on bit line BLai is thus read out. The read data is latched. This latched data will be used as a rewrite data. This embodiment is similar to the previous embodiment in data-conversion scheme wherein the rewrite data is converted from the memory cell data obtained during the verify-read period in accordance with the write data as shown in Table 1.

The write operation will be completed after the execution of the combination of the verify-read and rewrite operations is repeated for a predetermined number of times; one hundred, for example. With such verify-read/rewrite scheme of this embodiment, it is possible to suppress or prevent any "1"-written memory cell transistor from being increased in threshold voltage unnecessarily.

The potential changes of the control gates CG1 to CG8 and the select gates SG1, SG2 during the erase, write, verify-read and read operations are indicated in Table 4 presented below. Note that the table contents assume that the control gate CG2 and the bit line BLai are selected. "FLT" means the floating condition.

TABLE 4

| Line | Erase | Write "1" | Write "0" | Read | Verify |
|---|---|---|---|---|---|
| Bit Line BLai | FLT | 10 V | 0 V | 3 V | 3 V |
| Bit Line BLbi | FLT | 0 V | 0 V | 2 V | 2 V |
| Select Gate SG1 | 20 V | 10 V | 10 V | 5 V | 5 V |
| Control Gate CG1 | 0 V | 10 V | 10 V | 5 V | 5 V |
| Control Gate CG2 | 0 V | 20 V | 20 V | 0 V | 0.5 V |
| Control Gate CG3 | 0 V | 10 V | 10 V | 5 V | 5 V |
| Control Gate CG4 | 0 V | 10 V | 10 V | 5 V | 5 V |
| Control Gate CG5 | 0 V | 10 V | 10 V | 5 V | 5 V |
| Control Gate CG6 | 0 V | 10 V | 10 V | 5 V | 5 V |
| Control Gate CG7 | 0 V | 10 V | 10 V | 5 V | 5 V |
| Control Gate CG8 | 0 V | 10 V | 10 V | 5 V | 5 V |
| Select Gate SG2 | 20 V | 0 V | 0 V | 5 V | 5 V |
| Source Line | FLT | 0 V | 0 V | 0 V | 0 V |
| Substrate | 20 V | 0 V | 0 V | 0 V | 0 V |

The present invention may also be applied to NOR-cell type EEPROMs, one preferred embodiment of which will be described below.

A NOR-cell EEPROM shown in FIG. 19 includes an array or memory cells each consisting of one twin-gate MOS transistor M with a floating gate and a control gate. These memory cell transistors are arranged in rows and columns to provide a matrix form. The rows of cell transistors M are coupled to word lines WLi, WLi+1, WLi+2, . . . at their control gates. The columns of cell transistors M are coupled to bit lines BL0, BL1, . . . , BLm at the drain electrodes thereof. To reduce the threshold voltage of a cell transistor causing a logic "1" data to be written thereinto, a specific voltage of the negative polarity (−12 volts, for example) is applied to the control gate of that transistor, while the power supply voltage Vcc is applied to the drain of it. At this time, non-selected cell transistors that have the control gates coupled in common to the control gate of the selected cell transistor are applied with a zero-volt voltage at their drains, thereby to cause these non-selected cell transistors to remain unchanged in their threshold voltages.

Figure 20:
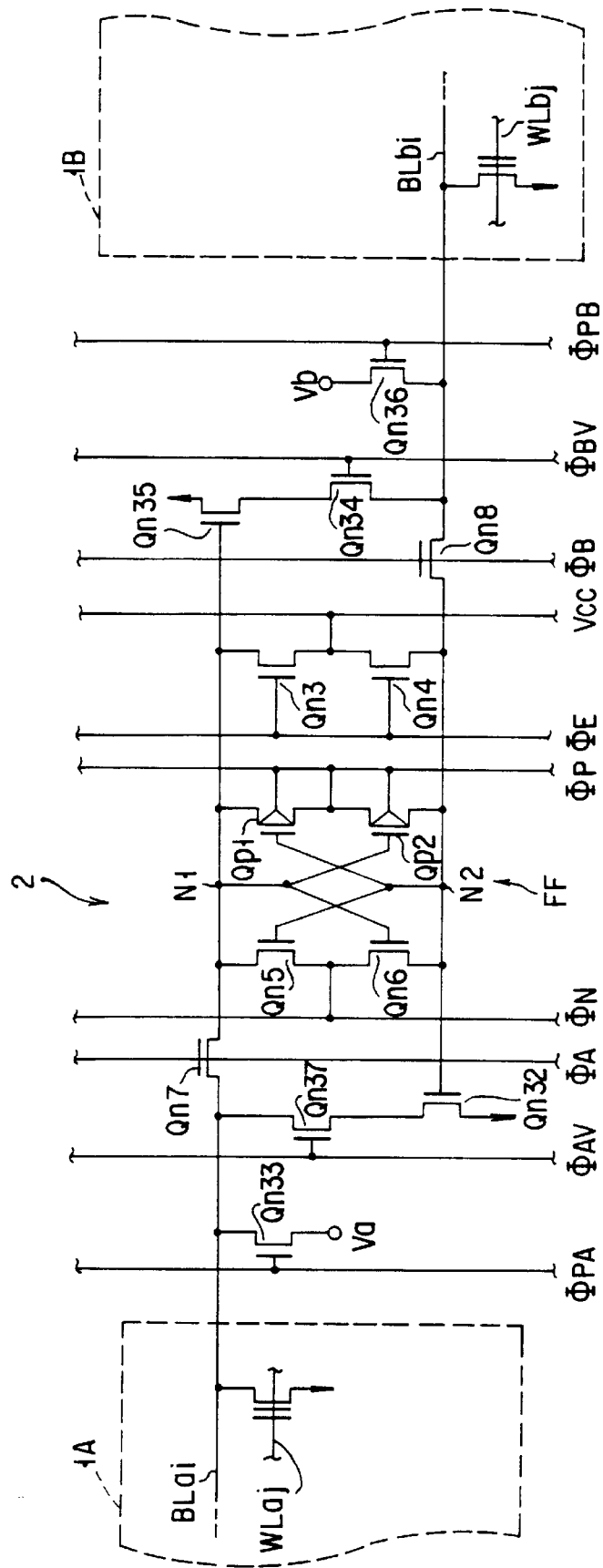
FIG. 20 is a diagram showing the internal arrangement of a bit-line control circuit used in the NOR-type EEPROM of FIG. 19.

As shown in FIG. 20, a bit-line controller 2 including the data-latch/sense amplifier circuitry is connected to bit lines BLai, BLbi, which are associated with first and second NOR cell blocks 1A, 1B each having the memory cell matrix of FIG. 19. Bit-line controller 2 latches therein a data determining whether or not the threshold voltage of a selected cell transistor is to be changed. The data-latch/sense amplifier circuitry includes a CMOS flip-flop FF, which is similar to that of FIG. 5. E-type N-channel MOS transistor Qn31, Qn32, Qn34, Qn35 are verify-read devices. E-type N-channel MOS transistors Qn33, Qn36 are arranged for precharging and resetting the bit lines.

With embodiment, after a threshold-voltage reduction operation is performed with respect to a certain cell transistor, a resultant threshold voltage is verified using a verify voltage having a predetermined potential level, which is applied to the control gate of the cell transistor that has been reduced in threshold voltage. It the verify operation reveals the fact that the resultant threshold voltage is not changed up to a target level, the same write operation is executed for the same cell transistor, thereby forcing the threshold voltage thereof to further decrease. The verify process will be continued until it is verified that the threshold voltage of the cell transistor succeeds in falling within an allowable range.

Figure 21:
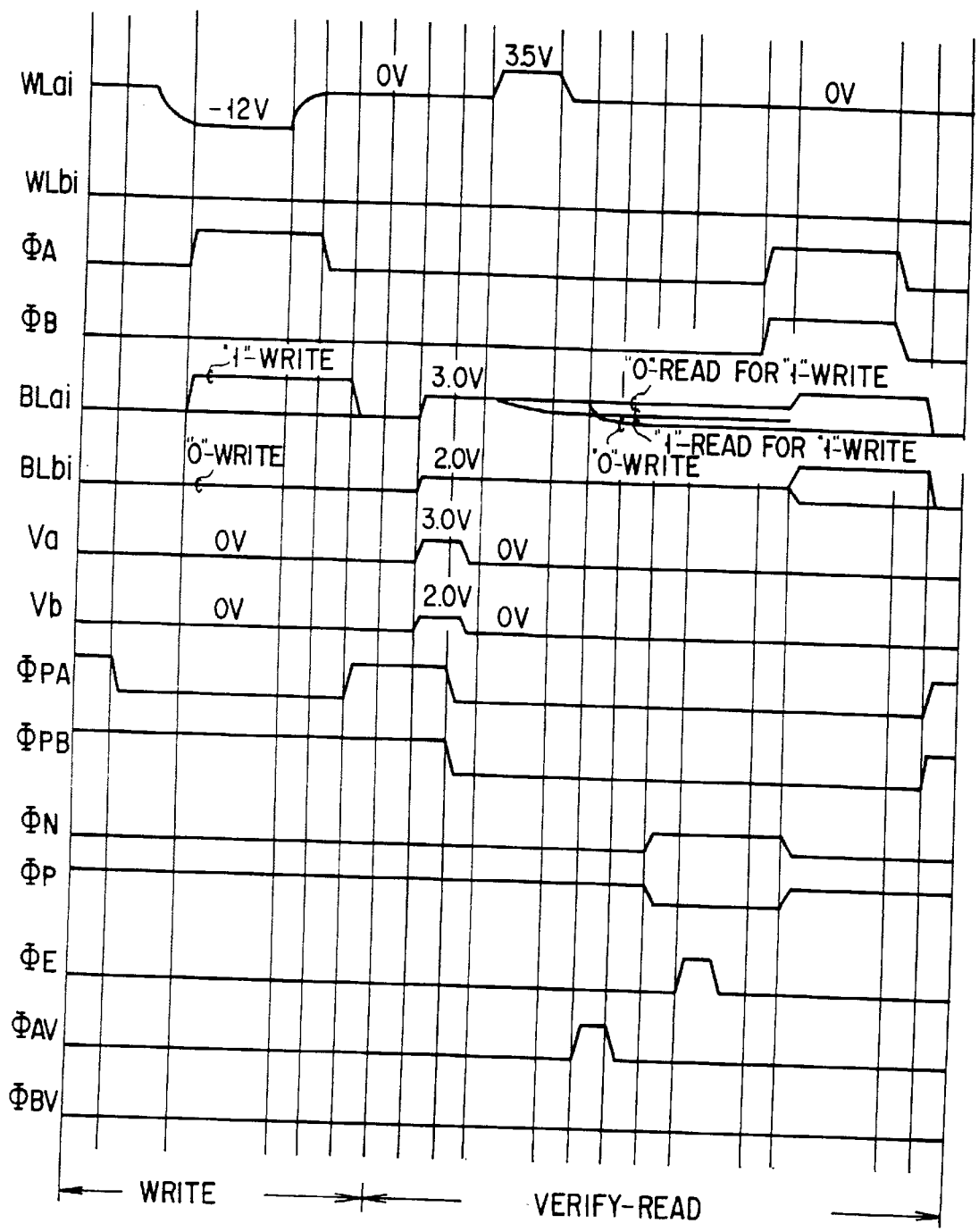
FIG. 21 is a timing diagram showing potential variations at the main circuit components of the fourth embodiment during write and verify operations thereof.

The write and verify operations of the NOR-cell EEPROM will now be described with reference to the timing diagram shown in FIG. 21. Prior to the execution of write operation, an erase operation is performed in a manner that those cell transistors associated with each word line are erased at a time. Such "word-by-word" erase operation is performed by applying a boosted high-level voltage (20 volts, for example) to every word line WLi coupled to the control gates of a corresponding row of cell transistor, and by applying a zero-volt voltage to the bit lines BL. With such voltage application, electrons are injected into the floating gates of these cell transistors, causing the threshold voltages to increase beyond the power supply voltage Vcc.

The write operation is carried out for the memory cell transistors constituting one page (page-block erase). First of all, a precharge signal φPA drops to the "L" level, thus rendering bit line BLai electrically floating. A word line WLaj of FIG. 20 is then at −12 volts. When φA is at the "H" level, bit line BLai is potentially changed according to the logic level of a write data: When the write data is a logic "1" (releasing electrons from the floating gate), bit line BLai is at the power supply voltage Vcc; when the write data is a "0" (preventing electrons from being released from the floating gate), bit line BLai is at zero volts. After the word line is reset, signal φPA goes high to reset the bit line. At this time, the write operation is terminated.

A verify operation is then performed. Signals Va, Vb being applied to the precharging/resetting transistors Qn33, Qn36 of FIG. 20 are changed to about 3 volts, 5 volts, respectively, causing the bit line BLai to be precharged to 3 volts, and causing bit line BLbi to be precharged at 2 volts. Bit lines BLai, BLbi are rendered electrically floating when signals φPA, φPB are returned to the "L" level. The word line potential is equivalent to the verify voltage of 3.5 volts, so that a data is read out. If a logic "0" has been written in a memory cell transistor being selected for a data read, bit line BLai remains at 3 volts. If a logic "1" has been written in the cell transistor being lower than 3.5 volts in its threshold voltage, bit line BLai potentially decreases.

After the word line is at zero volts, the signal φAV is changed to the "H" level. When a logic "0" data is being latched to write the "0" into a selected cell transistor, or when it is not required to further write a "1" data into a cell transistor that has already been written with "1," the two transistors Qn31, Qn32 of FIG. 20 are controlled to turn on, causing bit line BLai to potentially decrease below the potential on a corresponding dummy bit line, which is practically at zero volts. In a case where a logic "1" has been written into the selected cell transistor, bit line BLai does not vary in potential because transistor Qn32 is rendered non-conductive.

Thereafter, the signals φP, φN are changed at Vcc/2. The signal φE goes high. The CMOS flip-flop FF is thus equalized. When φP is at the power supply voltage Vcc, and when φN is at zero volts, a bit line potential is read out, and is then latched as a rewrite data, which will be used later. The relation among the write data, the read data and the rewrite data is same as that of the embodiment previously explained with reference to Table 1.

Note here that, in the above embodiment, the memory cell matrix may be formed in a P type well region, which is applied with a negative voltage, such as −12 volts, with the power supply voltage Vcc being applied to a selected word line, and the negative voltage (−12 volts) being also applied to the non-selected word lines. If it is required that the definitions of "write" and "erase" are replaced by each other, the N-channel MOS transistors Qn31, Qn32, Qn34, Qn35 of FIG. 20 may be removed to make narrower the threshold voltage distribution of the memory cell transistors in the same manner as in the embodiment explained previously.

Figure 22:
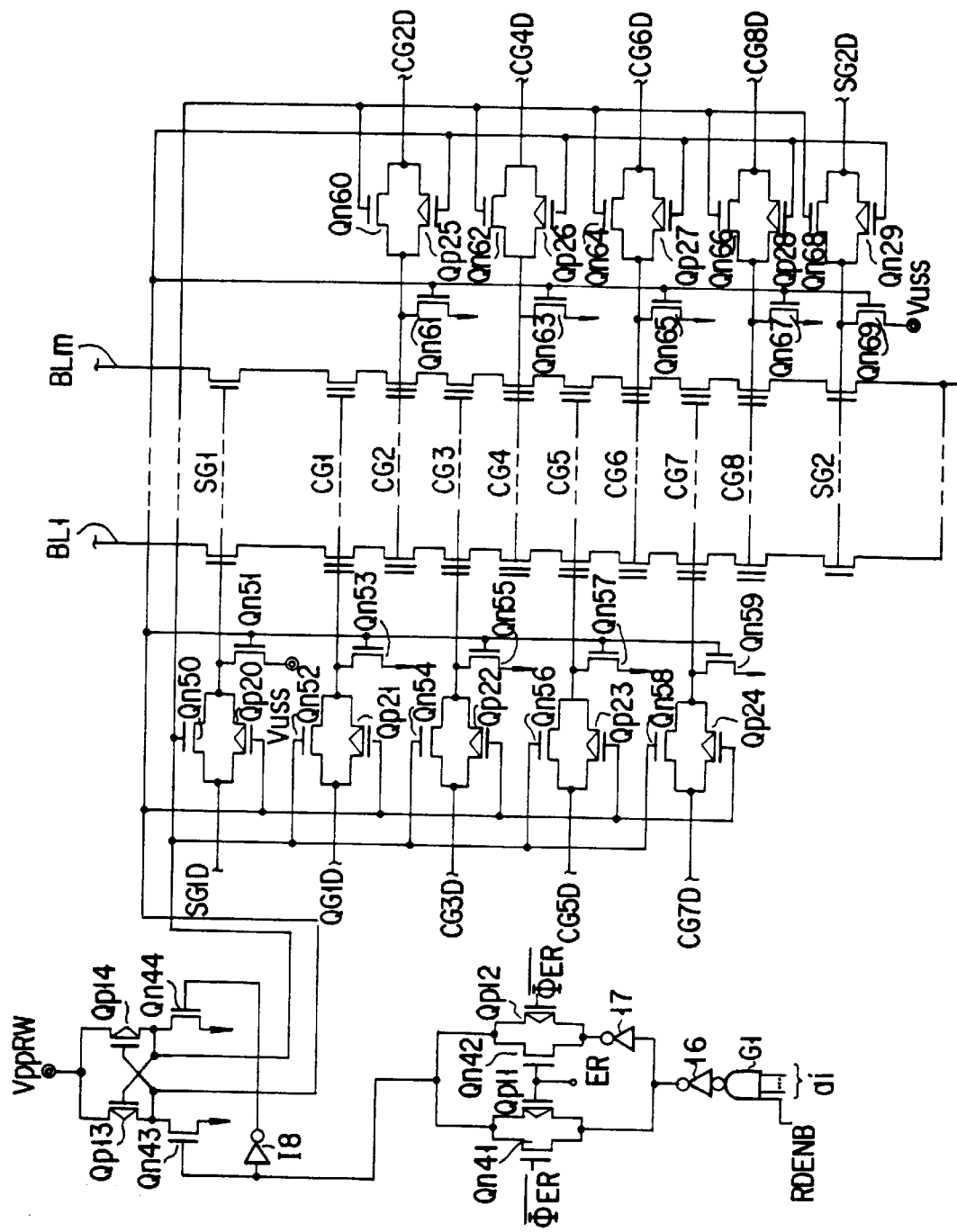

The internal circuit configuration of the row decoder 5 shown in FIG. 1 or 13 may be arranged as shown in FIG. 22, wherein the row decoder includes an enable circuit, which is constituted by E-type N-channel MOS transistors Qn41, Qn42 and E-type P-channel MOS transistors Qp11, Qp12, and a transfer circuit constituted by E-type N-channel MOS transistors Qn43, Qn44 and E-type P-channel MOS transistors Qp13, Qp14. The row decoder is activated by an address signal ai and a decoder-enable signal RDENB to select one of the cell blocks 1A, 1B shown in FIGS. 13, 14 or 20. The row decoder operates when a signal φER goes high, which is applied to the common gate of transistors Qp11, Qn42 of FIG. 22. A voltage VppRW being applied to the transistors Qp13, Qp14 is at the power supply voltage Vcc during a read period; the voltage VppRW will rise at the boosted high-level voltage Vpp during an erase and a write period.

E-type N-channel MOS transistors Qn50 to Qn69 and E-type P-channel MOS transistors Qp20 to Qp29 are arranged to constitute a plurality of transfer gates, which may "open" selectively, in response to an output signal of the row decoder, thereby allowing (1) select-gate potentials SG1d, SG2d, (2) control-gate potentials CG1D to CG8D and (3) the potential at a non-selected select gate Vuss to be transferred therethrough. The signals Vuss, SG1D, SG2D, CG1D to CG8D are common to each row decoder.

The potential changes of the select gates SG1, SG2, the control gates CG1 to CG8, the bit lines, and the signals SG1D, SG2D, CG1D–CG8D, Vuss, VppRW during the read, erase, write and verify-read operations are indicated in Table 5 below. The table contents assume that the control gate CG2 and the bit line BLai are selected. "FLT" means the floating condition.

TABLE 5

| Line | Erase | | Write | | Verify- |  |
| | Non-Select Block | Select Block | "1" | "0" | Read | Read |
|---|---|---|---|---|---|---|
| BLai | FLT | FLT | 0 V | 10 V | 3 V | 3 V |
| BLbi | FLT | FLT | 0 V | 0 V | 2 V | 2 V |
| SG1 | 20 V | 20 V | 10 V | 10 V | 5 V | 5 V |
| CG1 | 0 V | 20 V | 10 V | 10 V | 5 V | 5 V |
| CG2 | 0 V | 20 V | 20 V | 20 V | 0 V | 0.5 V |
| CG3 | 0 V | 20 V | 10 V | 10 V | 5 V | 5 V |
| CG4 | 0 V | 20 V | 10 V | 10 V | 5 V | 5 V |
| CG5 | 0 V | 20 V | 10 V | 10 V | 5 V | 5 V |
| CG6 | 0 V | 20 V | 10 V | 10 V | 5 V | 5 V |
| CG7 | 0 V | 20 V | 10 V | 10 V | 5 V | 5 V |
| CG8 | 0 V | 20 V | 10 V | 10 V | 5 V | 5 V |
| SG2 | 20 V | 20 V | 0 V | 0 V | 5 V | 5 V |
| Source | 20 V | 20 V | 0 V | 0 V | 0 V | 0 V |
| Substrate (P-well) | 20 V | 20 V | 0 V | 0 V | 0 V | 0 V |
| SG1D | 20 V | 20 V | 10 V | 10 V | 5 V | 5 V |
| CG1D | 20 V | 20 V | 10 V | 10 V | 5 V | 5 V |
| CG2D | 20 V | 20 V | 20 V | 20 V | 0 V | 0.5 V |
| CG3D | 20 V | 20 V | 10 V | 10 V | 5 V | 5 V |
| CG4D | 20 V | 20 V | 10 V | 10 V | 5 V | 5 V |
| CG5D | 20 V | 20 V | 10 V | 10 V | 5 V | 5 V |
| CG6D | 20 V | 20 V | 10 V | 10 V | 5 V | 5 V |
| CG7D | 20 V | 20 V | 10 V | 10 V | 5 V | 5 V |
| CG8D | 20 V | 20 V | 10 V | 10 V | 5 V | 5 V |
| SG2D | 20 V | 20 V | 0 V | 0 V | 5 V | 5 V |
| VppRW | 20 V | 20 V | 20 V | 20 V | 5 V | 5 V |
| Vuss | 20 V | 20 V | 0 V | 0 V | 0 V | 0 V |

The above row decoder may alternatively be modified as shown in FIG. 23. The potential changes at the main components thereof are shown in Table 6 presented below, wherein CG1D to CG8D are at zero volts rather than 20 volts during an erase period.

TABLE 6

| Line | Erase | | Write | | Verify- |  |
| | Non-Select Block | Select Block | "1" | "0" | Read | Read |
|---|---|---|---|---|---|---|
| BLai | FLT | FLT | 0 V | 10 V | 3 V | 3 V |
| BLbi | FLT | FLT | 0 V | 0 V | 2 V | 2 V |
| SG1 | 20 V | 20 V | 10 V | 10 V | 5 V | 5 V |
| CG1 | 0 V | 20 V | 10 V | 10 V | 5 V | 5 V |
| CG2 | 0 V | 20 V | 20 V | 20 V | 0 V | 0.5 V |
| CG3 | 0 V | 20 V | 10 V | 10 V | 5 V | 5 V |
| CG4 | 0 V | 20 V | 10 V | 10 V | 5 V | 5 V |
| CG5 | 0 V | 20 V | 10 V | 10 V | 5 V | 5 V |
| CG6 | 0 V | 20 V | 10 V | 10 V | 5 V | 5 V |
| CG7 | 0 V | 20 V | 10 V | 10 V | 5 V | 5 V |
| CG8 | 0 V | 20 V | 10 V | 10 V | 5 V | 5 V |
| SG2 | 20 V | 20 V | 0 V | 0 V | 5 V | 5 V |
| Source | 20 V | 20 V | 0 V | 0 V | 0 V | 0 V |
| Substrate (P-well) | 20 V | 20 V | 0 V | 0 V | 0 V | 0 V |
| SG1D | 20 V | 20 V | 10 V | 10 V | 5 V | 5 V |
| CG1D | 0 V | 0 V | 10 V | 10 V | 5 V | 5 V |
| CG2D | 0 V | 0 V | 20 V | 20 V | 0 V | 0.5 V |
| CG3D | 0 V | 0 V | 10 V | 10 V | 5 V | 5 V |
| CG4D | 0 V | 0 V | 10 V | 10 V | 5 V | 5 V |
| CG5D | 0 V | 0 V | 10 V | 10 V | 5 V | 5 V |
| CG6D | 0 V | 0 V | 10 V | 10 V | 5 V | 5 V |
| CG7D | 0 V | 0 V | 10 V | 10 V | 5 V | 5 V |

TABLE 6-continued

| Line | Erase | | Write | | Verify- |  |
| | Non-Select Block | Select Block | "1" | "0" | Read | Read |
|---|---|---|---|---|---|---|
| CG8D | 0 V | 0 V | 10 V | 10 V | 5 V | 5 V |
| SG2D | 20 V | 20 V | 0 V | 0 V | 5 V | 5 V |
| VppRW | 20 V | 20 V | 20 V | 20 V | 5 V | 5 V |
| Vuss | 20 V | 20 V | 0 V | 0 V | 0 V | 0 V |

Figure 24:
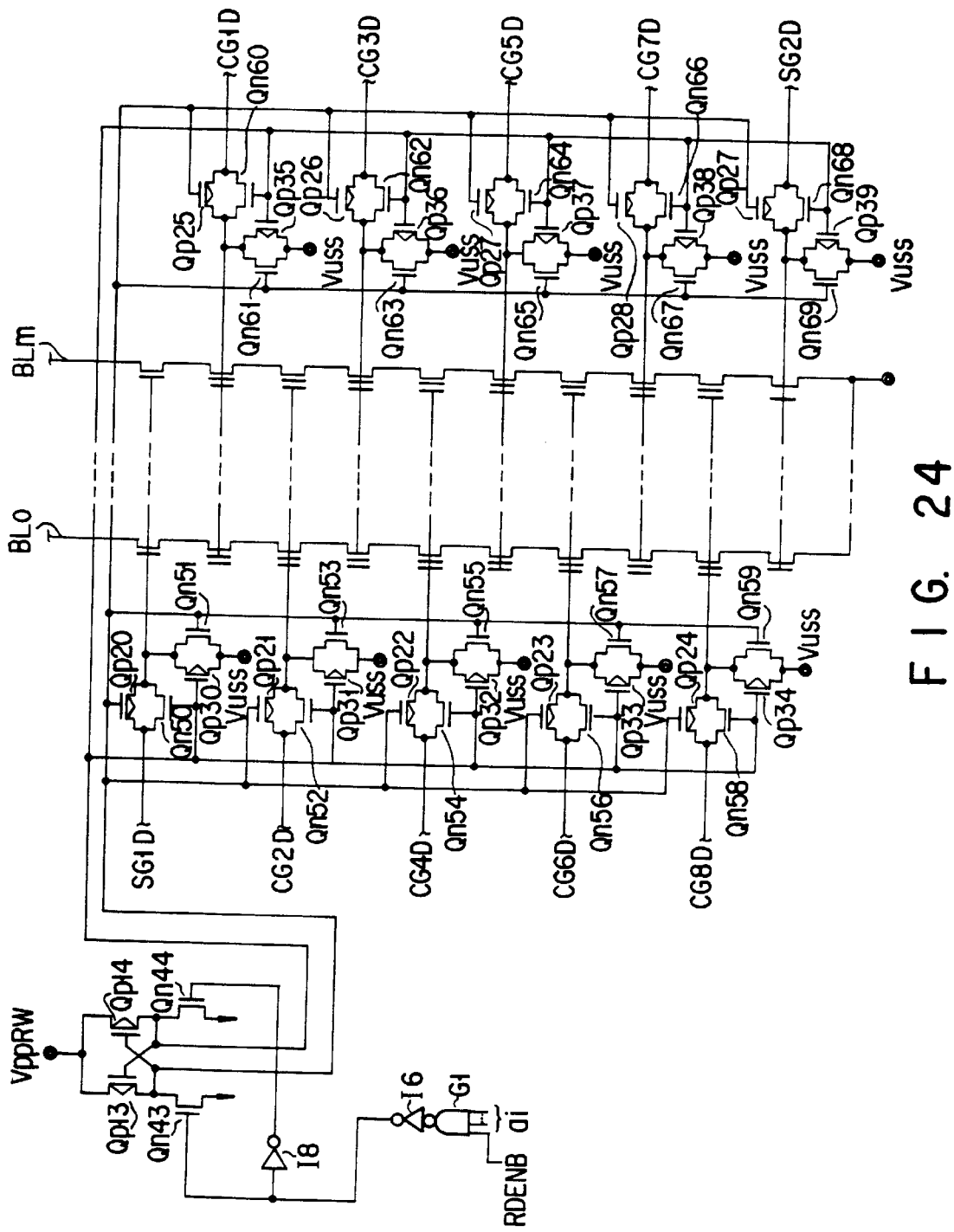

A still another modification of the row decoder 5 is illustrated in FIG. 24. This row decoder is similar to that of FIG. 23 with E-type P-channel MOS transistors Qp30 to Qp39 being added. While the potentials at non-selected control gates are small as well as Vcc–Vhl in the arrangement of FIG. 23, the row decoder arrangement of FIG. 23 will be more preferable than that of FIG. 24 in that the former is less in necessary circuit area than the latter, if the potential Vhl remains smaller to the extent that the data storage characteristic of memory cell transistors is not affected practically.

The bit-line control circuit 2 shown in FIGS. 5, 10 or 14 operates under the power supply voltage Vcc of 5 volts. The bit-line controller will be used in a low-power EEPROM using a decreased power supply voltage of 3 volts or less, which is fed by two dry batteries in a small computer, for example. If this is the case, the controller may be arranged as will be explained below.

In the first place, assume that the N-channel MOS transistors Qn10, Qn11 are less in threshold voltage than the other E-type N-channel MOS transistors. Such definition is introduced because the transmission efficiency of voltage potential decreases if the threshold voltage remains higher. The recommended threshold voltage for an increased voltage transmission efficiency is as follows:

$$Vcc - Vth(V_{RH}) > V_{RH},$$

$$Vth(V_{RL}) > -V_{RL},$$

where, "$V_{RH}$" is the voltage on a bit line at the "H" level during a read period, and "$V_{RL}$" is a bit-line voltage at the "L" level during the read period. Assume that Vcc=3V, $V_{RH}$=1.4V, and $V_{RL}$=1.2V. Vth(1.4)<1.6V, and Vth(1.2)>−1.2V, where the value in the parenthesis, such as 1.4, 1.2, indicates the back-bias voltage. The aforementioned other E-type N-channel MOS transistors increase in leak current if their threshold voltages Vth decrease; accordingly, Vth will not be modified in the practical application. By taking it into consideration, circuits of FIGS. 25 and 26 are employed as the driver circuit for the signals φPA, φPB, φAV, φBV, φA, φB, φE.

With the circuit of FIG. 25A, the "H" level of each signal can be increased to become higher than the power supply voltage Vcc. More specifically, as shown in FIG. 25B, the gate of a D-type N-channel MOS transistor allowed Qd2 coupled between input and output voltages Vin, Vout is potentially changed to zero volts after the elapse of a delay time τ1 from a time point at which input signal Vin is equivalent to Vcc. After a delay time τ2 has elapsed, output voltage Vout is boosted to a potential level higher than Vcc.

Figure 26A:
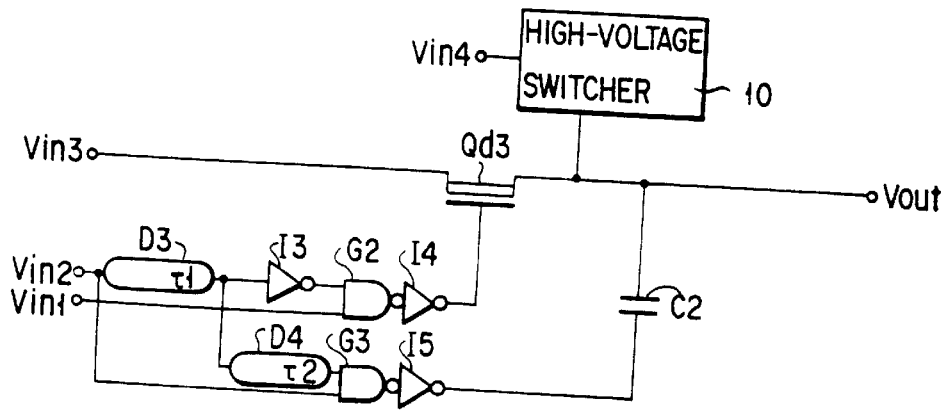
FIG. 26A is a diagram showing another exemplary circuit arrangement of the drive circuit for boosting the potentials of signals.
Figure 26B:
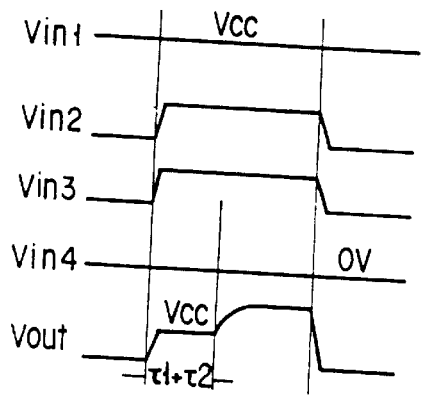
FIGS. 26B and 26C are timing diagrams therefor.
Figure 26C:
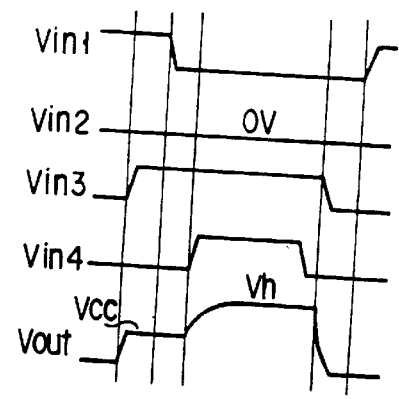
Figure 27:
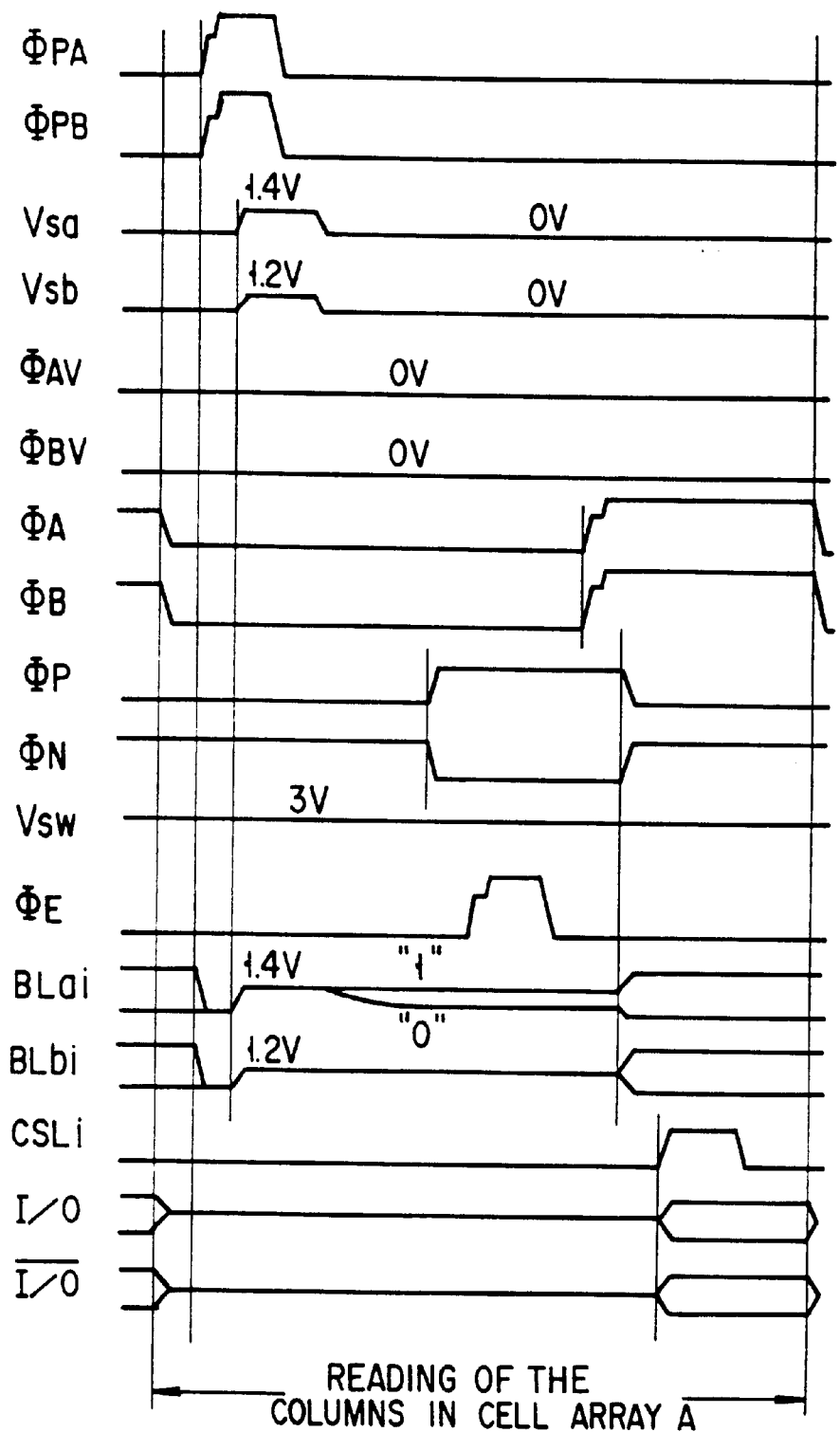
FIG. 27 is a timing diagram showing potential variations at the main circuit components of the EEPROM using the driver circuit shown in FIG. 25A or 26A during a read operation with respect to the columns in a first memory cell block thereof.
Figure 28:
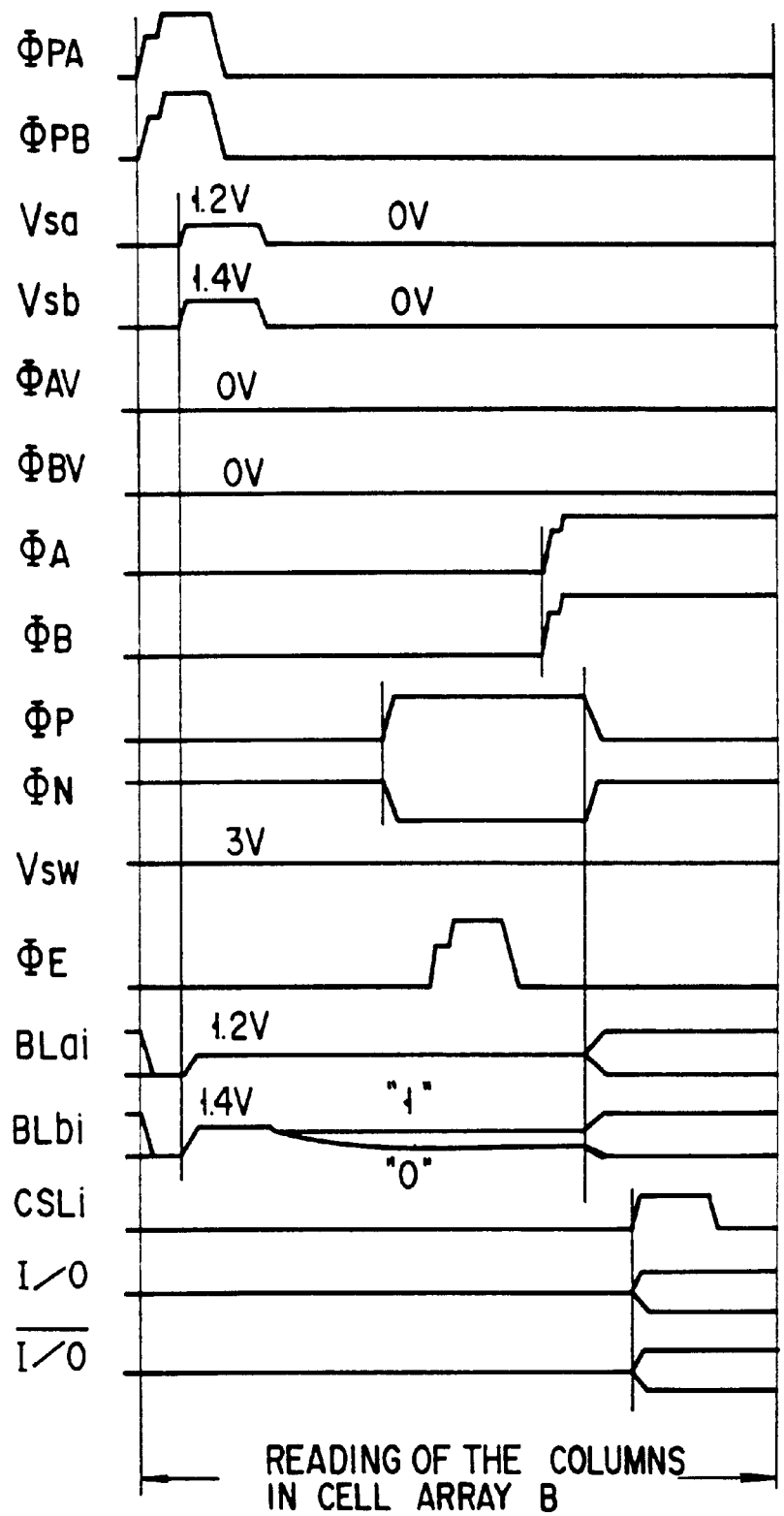
FIG. 28 is a timing diagram showing potential variations at the components during a read operation for the columns in a second memory cell block of the EEPROM.
Figure 30:
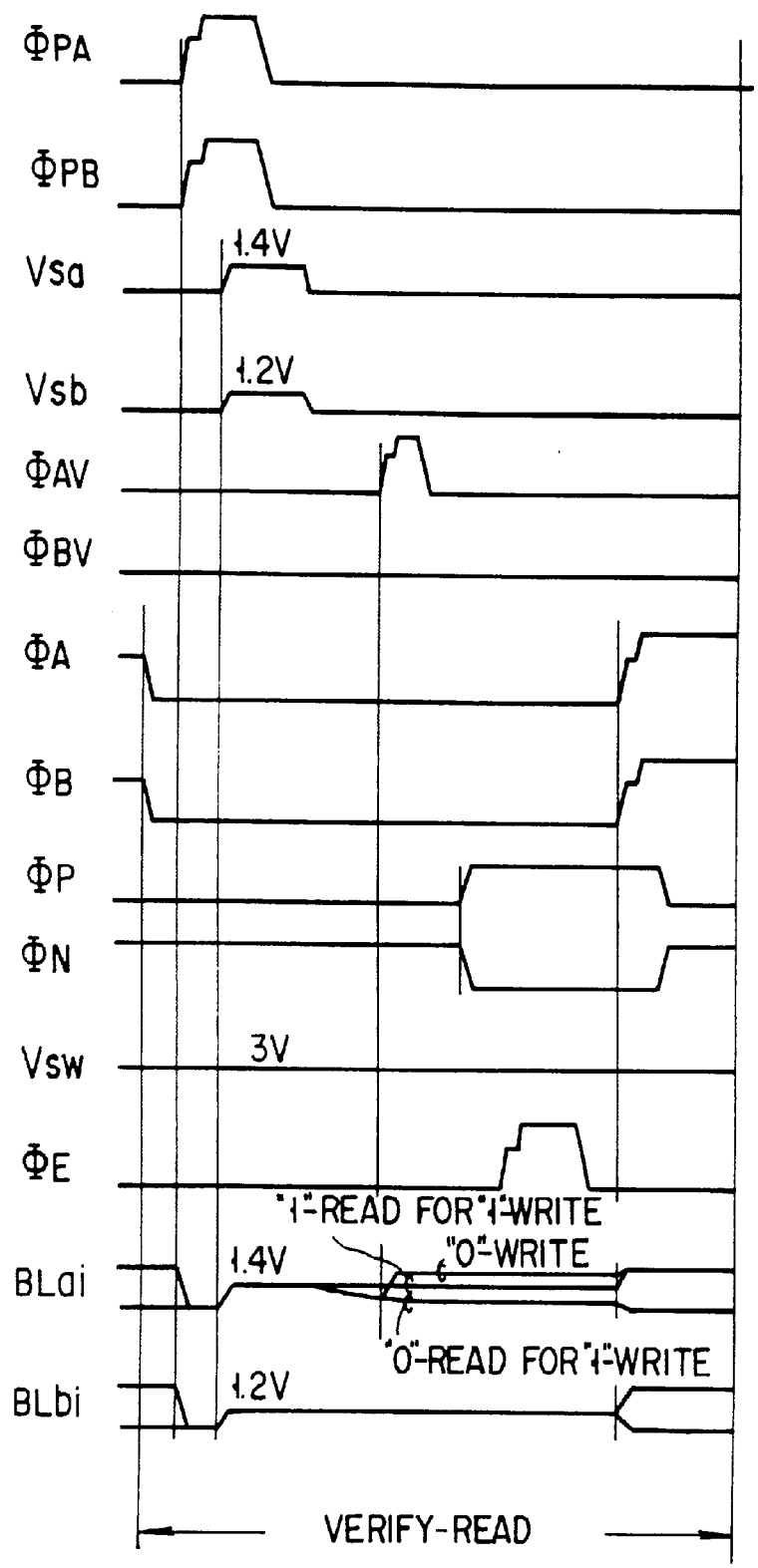
FIGS. 30 and 31 are timing diagrams showing two possible potential variations thereat during a verify-read operation.

A circuit shown in FIG. 26A is similar to that of FIG. 25A with a high-voltage switching circuit 10 being added. The high voltage may be the intermediate voltage (=10V) or the high-level voltage Vpp(=20V). In this case, as shown in FIG. 26B, after delay time τ1 has elapsed since input signals Vin3, Vin2 was changed at Vcc, the gate of the D-type N-channel MOS transistor Qd3 is set at zero volts. After the elapse of another delay time τ2, the output voltage Vcc is boosted to become higher than Vcc. An output operation of such high voltage is as follows. As shown in FIG. 26C, after an input voltage Vin3 is at Vcc, a signal Vin1 is set at zero volts causing the gate of transistor Qd3 to drop to zero volts. Thereafter, when an input signal Vin4 supplied to high-voltage switcher 10 is set at Vcc, this circuit generates a high voltage that potentially corresponds to either the intermediate voltage Vm or the power supply voltage Vcc.

The pulsing sequences of the bit-line control circuit arranged described above are illustrated in FIGS. 27 to 30, which are similar to those of FIGS. 15 to 18 with each signal being boosted as required.

Figure 31:
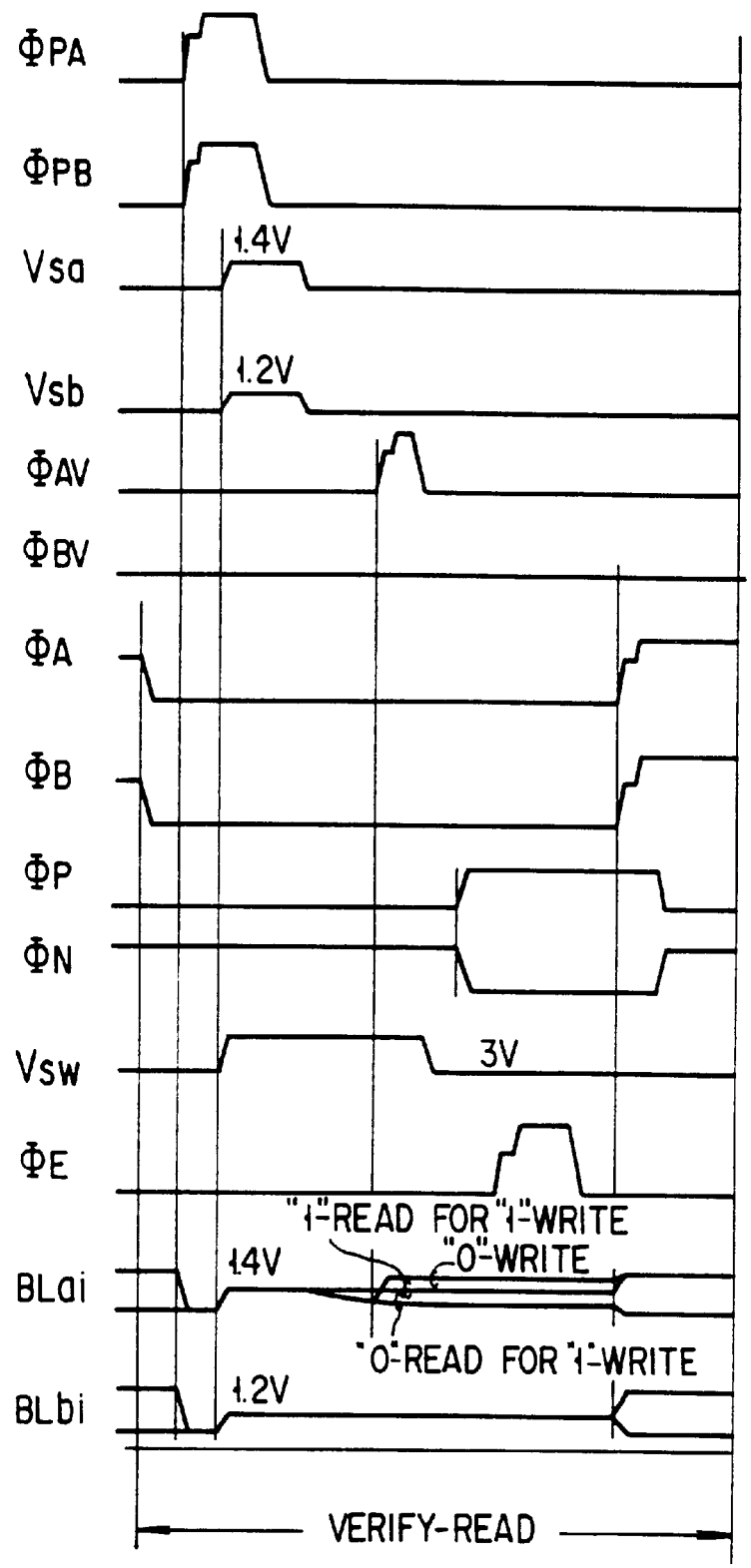
Figure 32A:
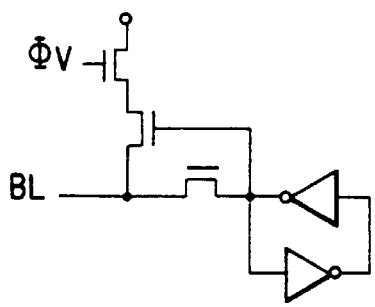
FIGS. 32A to 32H are diagrams showing several arrangements of a bit-line control circuit that is possibly employed in the above-mentioned NAND-cell EEPROMs.
Figure 32B:
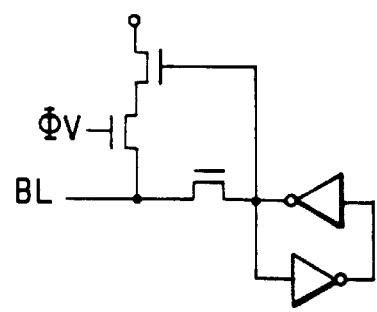
Figure 32C:
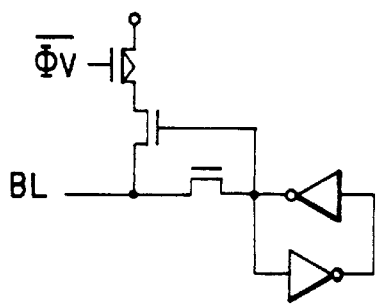
Figure 32D:
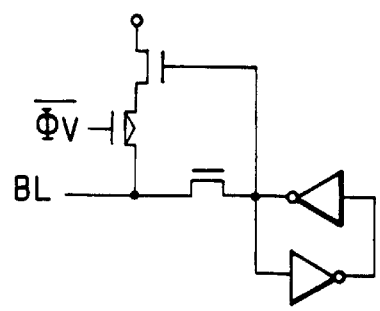
Figure 32E:
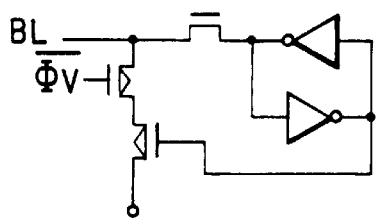
Figure 32F:
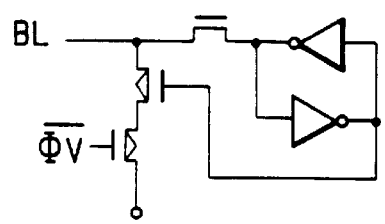
Figure 32G:
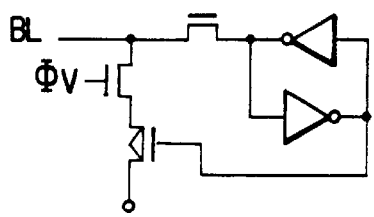
Figure 32H:
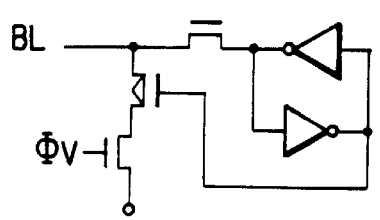
Figure 33A:
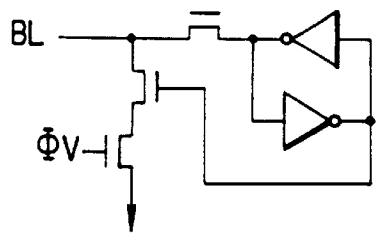
FIGS. 33A to 33H are diagrams showing several arrangements of a bit-line control circuit that is possibly employed in the above-mentioned NOR-cell EEPROM.
Figure 33B:
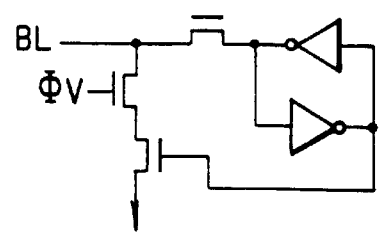
Figure 33C:
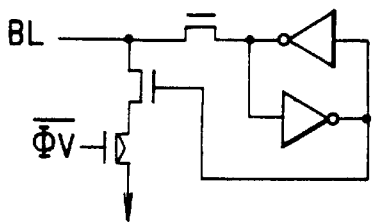
Figure 33D:
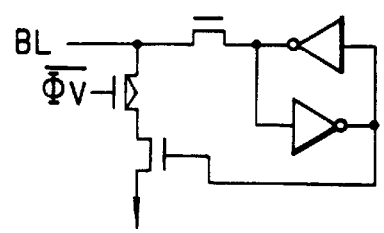
Figure 33E:
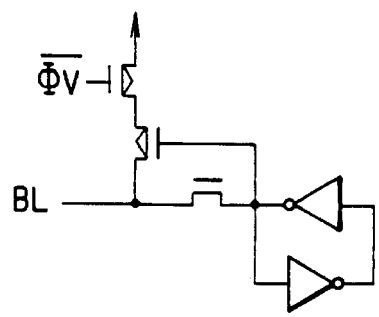
Figure 33F:
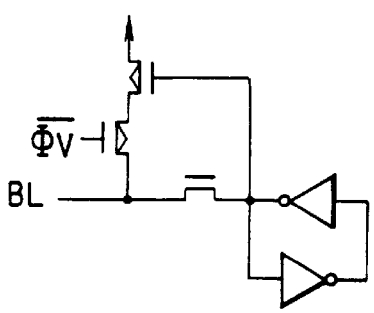
Figure 33G:
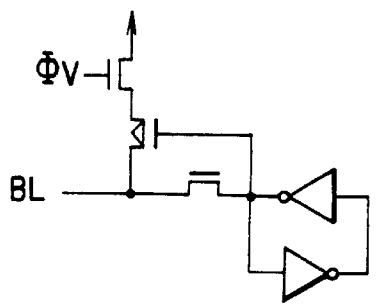
Figure 33H:
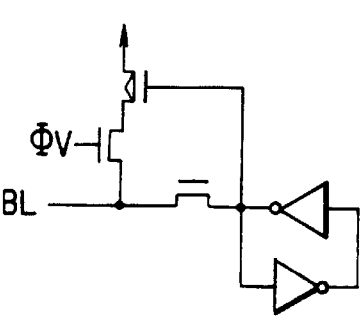

A further embodiment for a Vcc-reduction of low-power EEPROMs will be explained on the basis of the bit-line control circuit of FIG. 14, wherein the transistors Qn10, Qn11 are normally designed E-type N-channel MOS transistors. The voltage Vsw for the CMOS flip-flop circuit FF, which includes transistors Qn5, Qn6, Qn25, Qp1, Qp2, Qp8, is boosted up to an increased potential level during a verify-read period. The pulsing sequences of this embodiment are shown in FIG. 31, which is similar to FIG. 30 with voltage Vsw being boosted.

FIGS. 32A to 32H show several possible modifications of the bit-line control circuit 2 of the NAND-cell type EEPROMs previously described. Each of these figures indicates the circuit connected among the transistors Qn9, Qn10 of FIG. 4, transistors Qn22, Qn23, transistors Qn9, Qn10 or Qn11, Qn12 shown in FIG. 14, the CMOS flip-flop FF and a selected bit line being associated therewith. The presentation teaches that, even when N-channel MOS transistors are replaced by P-channel MOS transistors, the same circuit function may be attained by modifying the related circuit-connection among transistors.

The bit-line control circuit 2 of FIG. 20 used in the NOR-cell type EEPROM of FIG. 19 may be variously modified as shown in FIGS. 33A to 33H, each of which indicates the connection between the transistors Qn31, Qn32 or Qn34, Qn35 of FIG. 20, the flip-flop circuit FF and a selected bit line associated therewith. In this case also, when N-channel MOS transistors are replaced by P-channel MOS transistors, the same circuit function may be attained by modifying the related connection among transistors.

Note that, while the drain of the MOS transistor Qn9 is coupled to the power supply voltage Vcc in the embodiment of FIG. 5, such gate voltage may be changed to a different potential level that is higher than the "H" level potential of bit line during a read period. Similarly, the source of the transistor Qn32 of FIG. 20, which is coupled to the ground potential, may be changed to another potential that is lower than the "L" level of bit line during a read period.

With such an arrangement, the write/write-verify operation for such EEPROM may be performed as shown in the flowchart of FIG. 34A or 34B. In the flowchart of FIG. 34A, a write data is input in a page mode. After the data input, a write operation is carried out. A write-verify is executed with respect to every memory cell transistor that has been written with the data, by reading the actual storage data of this cell transistor. If an output data is at a logic "1" level, that is, the cell transistor is an "insufficiently-written" cell transistor, a rewrite operation is performed therefor. The set of the read for write-verify process and the rewrite process will be repeatedly executed until an output data of each cell transistor is at a logic "1" level.

With the embodiment of FIG. 34B, the judgment of whether the output data is a logic "1" is performed with respect to all the memory cell transistor included being subjected to the data write at a time, after the write/write-verify processes have been repeated for a predetermined time (ten times, for example). The data read for a write-verify is not output every time. This will be advantageous in a case wherein the total repeat number of the write and verify-read processes, since the program execution can become faster due to a decrease in the total length of write period.

The present invention is not limited to the above-described specific embodiments and may be practiced or embodied in still other ways without departing from the spirit or essential character thereof.

What is claimed is:

1. A method for controlling an electron amount in a floating gate of an electrically programmable non-volatile semiconductor memory cell, said memory cell being formed on a P-type semiconductor layer and having a control gate, a first N-type diffusion layer, and a second N-type diffusion layer, comprising the steps of:
   applying a negative voltage to said control gate while connecting a positive voltage to said first N-type diffusion layer for removing electrons from said floating gate to said first N-type diffusion layer;
   applying a positive verify voltage to said control gate for determining the electron amount in said floating gate of said memory cell; and
   disconnecting said positive voltage from said first N-type diffusion layer of said memory cell in which it is determined that the electron amount in said floating gate has been sufficiently decreased.

2. The method according to claim 1, wherein said first and second N-type diffusion layers are formed in the surface of said P-type semiconductor layer across a channel region, said floating gate is insulatively supported above said channel region by a gate insulation film, and said control gate is insulatively supported above said floating gate by a dielectric film.

3. The method according to claim 2, wherein said floating gate is insulatively spaced by said gate insulation film above said first N-type diffusion layer.

4. A method for controlling an electron amount in floating gates of first and second electrically programmable non-volatile semiconductor memory cells formed on a common P-type semiconductor layer, said first memory cell having a first floating gate, a first control gate, a first N-type diffusion layer, and a second N-type diffusion layer, said second memory cell having a second floating gate, a second control gate, a third N-type diffusion layer and a fourth N-type diffusion layer, said first and third N-type diffusion layers being connected to a common line, comprising the steps of:
   selecting said first memory cell;
   applying a negative voltage to said first control gate while connecting a positive voltage to said common line for removing electrons from said first floating gate to said first N-type diffusion layer;
   applying zero volt to said second control gate while connecting said positive voltage to said common line for maintaining the electron amount in said second floating gate;
   applying a positive verify voltage to said first control gate while applying zero volt to said second control gate for determining the electron amount in said first floating gate; and disconnecting said positive voltage from said common line if it is determined that the electron amount in said first floating gate has been sufficiently decreased.

5. The method according to claim 4, wherein said first and second N-type diffusion layers are formed in the surface of said P-type semiconductor layer across a first channel region, said third and fourth N-type diffusion layers are formed in the surface of said P-type semiconductor layer across a second channel region, said first and second floating gates are respectively and insulatively supported above said first and second channel regions by first and second gate insulation films, and said first and second control gates are respectively and insulatively supported above said first and second floating gates by first and second dielectric films.

6. The method according to claim 5, wherein said first and second floating gates are respectively and insulatively spaced by said first and second gate insulation films above said first and third N-type diffusion layers.

7. A method for controlling an electron amount in floating gates of electrically programmable non-volatile semiconductor memory cells having a common control gate and being formed on a common P-type semiconductor layer, each memory cell having a first N-type diffusion layer connected to a bit line and a second N-type diffusion layer connected to a source line, comprising the steps of:

applying a negative voltage to said common control gate;

applying a positive verify voltage to said common control gate for determining the electron amount in said floating gates of said memory cells;

connecting a positive voltage to the first N-type diffusion layers of the memory cells in which it is determined that there are surplus electrons in the floating gate for removing electrons from the floating gates to the first N-type diffusion layers; and disconnecting said positive voltage from the said first N-type diffusion layers of the memory cells in which it is determined that the electron amount in the floating gate has been sufficiently decreased.

8. The method according to claim 7, wherein said first and second N-type diffusion layers are formed in the surface of said P-type semiconductor layer across a channel region, said floating gate is insulatively supported above said channel region by a gate insulation film, and said control gate is insulatively supported above said floating gate by a dielectric film.

9. The method according to claim 8, wherein said floating gate is insulatively spaced by said gate insulation film above said first N-type diffusion layer.

* * * * *